United States Patent
Wong et al.

(10) Patent No.: US 9,554,491 B1
(45) Date of Patent: Jan. 24, 2017

(54) COOLING A DATA CENTER

(71) Applicant: Google Inc., Mountain View, CA (US)

(72) Inventors: Eehern J. Wong, El Macero, CA (US); Gregory P. Imwalle, Mountain View, CA (US); Emad Samadiani, Mountain View, CA (US)

(73) Assignee: Google Inc., Mountain View, CA (US)

( * ) Notice: Subject to any disclaimer, the term of this patent is extended or adjusted under 35 U.S.C. 154(b) by 276 days.

(21) Appl. No.: 14/321,343

(22) Filed: Jul. 1, 2014

(51) Int. Cl.
*F25B 21/02* (2006.01)
*H05K 7/20* (2006.01)

(52) U.S. Cl.
CPC ........... *H05K 7/20763* (2013.01); *F25B 21/02* (2013.01)

(58) Field of Classification Search
CPC ................................. F25B 21/02; H01L 35/30
USPC .................... 62/3.2, 3.3, 259.2; 361/696, 699
See application file for complete search history.

(56) References Cited

U.S. PATENT DOCUMENTS

| | | | |
|---|---|---|---|
| 3,807,493 A * | 4/1974 | Stewart | F28D 15/0275 165/104.14 |
| 6,065,293 A | 5/2000 | Ghoshal | |
| 6,570,895 B2 | 5/2003 | Heberle | |
| 6,822,861 B2 | 11/2004 | Meir | |
| 7,660,109 B2 * | 2/2010 | Iyengar | H05K 7/20754 165/104.33 |
| 8,087,254 B2 | 1/2012 | Arnold | |
| 8,179,930 B2 | 5/2012 | Musio et al. | |
| 8,259,765 B2 | 9/2012 | Rossi et al. | |
| 8,276,397 B1 | 10/2012 | Carlson et al. | |
| 8,483,247 B2 | 7/2013 | Rossi et al. | |
| 2004/0025515 A1 | 2/2004 | Evans | |
| 2005/0083657 A1 * | 4/2005 | Hamman | F28D 15/00 361/699 |
| 2011/0056674 A1 * | 3/2011 | Campbell | H05K 7/2079 165/247 |
| 2012/0111028 A1 * | 5/2012 | Campbell | F25B 40/00 62/3.7 |
| 2013/0312934 A1 | 11/2013 | Yasui | |

FOREIGN PATENT DOCUMENTS

| | | |
|---|---|---|
| WO | WO2013153517 A4 | 1/2014 |
| WO | WO2014022149 A1 | 2/2014 |

* cited by examiner

*Primary Examiner* — Melvin Jones
(74) *Attorney, Agent, or Firm* — Fish & Richardson P.C.

(57) ABSTRACT

A data center cooling system includes a cooling liquid supply conduit fluidly coupled between a cooling plant and an air-to-liquid heat exchanger positioned to receive a heated airflow from one or more racks. At least one rack supports a plurality of heat-generating electronic devices. The system further includes a cooling liquid return conduit fluidly coupled between the cooling plant and the air-to-liquid heat exchanger; and a heat transfer module thermally coupled to the cooling liquid supply and return conduits between the cooling plant and the air-to-liquid heat exchanger. The heat transfer module includes a cold side and a warm side, with the cold side thermally coupled to the cooling liquid supply conduit to transfer heat from a flow of a cooling liquid in the cooling liquid supply conduit to the warm side of the heat transfer module, and the warm side including a heat sink.

29 Claims, 6 Drawing Sheets

COOLING A DATA CENTER

TECHNICAL BACKGROUND

This disclosure relates to cooling systems, more particularly, cooling systems for cooling a data center.

BACKGROUND

In some cooling systems, chilled liquid is provided at a constant flow rate to cool a thermal system. Sometimes transients in an input heat load can cause a temperature of the thermal system to exceed a predetermined temperature threshold over short periods. A valve can be used to control the flow rate of the chilled liquid to reduce the temperature. However, the changing flow rate is limited by a slow response time of the valve and fluidic capacitance of a cooling system, and temperature transients can still exceed the predetermined temperature threshold. In some examples, placing a number of control actuators close to the heat load can reduce amplitudes of thermal deviations. However, it can be expensive and hard to implement and maintain.

SUMMARY

This disclosure discusses cooling systems and methods for cooling of data centers, for example, using a cooling module such as a thermoelectric cooling module or other cooling modules either alone or in combination with a heat exchanger (e.g., a cooling coil or other fluid-based cooling device). In some implementations, a data center cooling system includes a cooling liquid supply conduit fluidly coupled between a cooling plant and an air-to-liquid heat exchanger positioned to receive a heated airflow from one or more racks in a data center. At least one rack supports a plurality of heat-generating electronic devices. A cooling liquid return conduit is fluidly coupled between the cooling plant and the air-to-liquid heat exchanger. The cooling system also includes a heat transfer module thermally coupled to the cooling liquid supply and return conduits between the cooling plant and the air-to-liquid heat exchanger. The heat transfer module includes a cold side that is thermally coupled to the cooling liquid supply conduit to transfer heat from a flow of a cooling liquid to a warm side of the heat transfer module. The warm side includes a heat sink that is thermally coupled to the cooling liquid return conduit.

In an example implementation, a data center cooling system includes a cooling liquid supply conduit fluidly coupled between a cooling plant and an air-to-liquid heat exchanger positioned to receive a heated airflow from one or more racks in a data center. At least one rack supports a plurality of heat-generating electronic devices. The system further includes a cooling liquid return conduit fluidly coupled between the cooling plant and the air-to-liquid heat exchanger; and a heat transfer module thermally coupled to the cooling liquid supply and return conduits between the cooling plant and the air-to-liquid heat exchanger. The heat transfer module includes a cold side and a warm side, with the cold side thermally coupled to the cooling liquid supply conduit, that transfers heat from a flow of a cooling liquid in the cooling liquid supply conduit to the warm side of the heat transfer module, and the warm side including a heat sink that is thermally coupled to the cooling liquid return conduit.

In a first aspect combinable with the general implementation, the heat transfer module includes a thermoelectric cooling module.

In a second aspect combinable with any of the previous aspects, the thermoelectric cooling module includes a Peltier cooler.

In a third aspect combinable with any of the previous aspects, the thermoelectric cooling module includes a power input to receive electrical power.

A fourth aspect combinable with any of the previous aspects further includes a control valve fluidly coupled to one of the cooling liquid supply conduit or the cooling liquid return conduit, and configured to modulate a flow rate of the cooling liquid supplied to the air-to-liquid heat exchanger.

A fifth aspect combinable with any of the previous aspects further includes a control system communicably coupled to the control valve and the heat transfer module.

In a sixth aspect combinable with any of the previous aspects, the control system is configured to perform operations including determining a cooling load of the air-to-liquid heat exchanger; based on the determined cooling load, selecting at least one of the heat transfer module or the control valve to adjust; and based on selecting the heat transfer module, adjusting the heat transfer module to increase a heat transfer rate from the cold side to the warm side.

In a seventh aspect combinable with any of the previous aspects, the control system is further configured to perform operations including based on selecting the control valve, modulating the control valve to adjust the flow rate of the cooling liquid to the air-to-liquid heat exchanger.

In an eighth aspect combinable with any of the previous aspects, selecting at least one of the heat transfer module or the control valve to adjust includes determining a difference between a predicated cooling load and a present cooling load; and based on the determined difference, selecting at least one of the heat transfer module or the control valve to adjust.

A ninth aspect combinable with any of the previous aspects further includes a second heat sink thermally coupled to the heat sink.

In a tenth aspect combinable with any of the previous aspects, the second heat sink includes a phase change material attached to the heat sink.

In an eleventh aspect combinable with any of the previous aspects, the cooling plant includes a chillerless cooling plant.

In a twelfth aspect combinable with any of the previous aspects, the cold side includes an input to receive the flow of the cooling liquid from the cooling plant and an output to supply a cooled flow of cooling liquid to the air-to-liquid heat exchanger.

In a thirteenth aspect combinable with any of the previous aspects, the warm side includes an input to receive a heated flow of the cooling liquid from the air-to-liquid heat exchanger and an output to supply the heated flow of the cooling liquid to the cooling plant.

In another example implementation, a method for cooling a data center includes circulating a flow of a cooling liquid through a supply conduit from a cooling plant toward an air-to-liquid heat exchanger; circulating the flow of the cooling liquid through a heat transfer module that is thermally coupled to the supply conduit between the cooling plant and the air-to-liquid heat exchanger; heating the flow of the cooling liquid in the air-to-liquid heat exchanger; circulating the flow of the heated cooling liquid through a return conduit toward the cooling plant from the air-to-liquid heat exchanger; and transferring heat from the flow of the cooling liquid from a cold side of the heat transfer module to a warm side of the heat transfer module that is thermally coupled to the return conduit.

A first aspect combinable with the general implementation further includes circulating a heated airflow to the air-to-liquid heat exchanger from one or more racks in a data center, at least one rack supporting a plurality of heat-generating electronic devices.

A second aspect combinable with any of the previous aspects further includes heating the flow of the cooling liquid in the air-to-liquid heat exchanger with heat from the heated airflow.

In a third aspect combinable with any of the previous aspects, the heat transfer module includes a thermoelectric cooling module.

A fourth aspect combinable with any of the previous aspects further includes supplying electrical power to the thermoelectric cooling module.

A fifth aspect combinable with any of the previous aspects further includes circulating the cooling liquid through a control valve that is fluidly coupled to one of the supply conduit or the return conduit; and modulating a flow rate of the flow of the cooling liquid supplied to the air-to-liquid heat exchanger with the control valve.

A sixth aspect combinable with any of the previous aspects further includes determining a cooling load of the air-to-liquid heat exchanger; based on the determined cooling load, selecting at least one of the heat transfer module or the control valve to adjust; and based on selecting the heat transfer module, adjusting the heat transfer module to increase a heat transfer rate from the cold side to the warm side.

A seventh aspect combinable with any of the previous aspects further includes based on selecting the control valve, modulating the control valve to adjust the flow rate of the cooling liquid to the air-to-liquid heat exchanger.

In an eighth aspect combinable with any of the previous aspects, selecting at least one of the heat transfer module or the control valve to adjust includes determining a difference between a predicated cooling load and a present cooling load; and based on the determined difference, selecting at least one of the heat transfer module or the control valve to adjust.

In a ninth aspect combinable with any of the previous aspects, the warm side includes a first heat sink, and a second heat sink is thermally coupled to the first heat sink.

In a tenth aspect combinable with any of the previous aspects, the second heat sink includes a phase change material attached to the first heat sink.

In another general implementation, a data center cooling system includes a thermoelectric cooling module thermally coupled to a cooling liquid supply piping system and a cooling liquid return piping system; a cooling coil fluidly coupled to the cooling liquid supply piping system and the cooling liquid return piping system, and a control system that includes a controller and a control valve that is positioned in one of the cooling liquid supply piping system or the cooling liquid return piping system. The cooling coil is positioned to transfer heat from an airflow circulated over rack-mounted heat generating electronic devices in a data center to a flow of a cooling liquid circulated through the cooling liquid supply piping system and the cooling liquid return piping system. The control system is communicably coupled to the thermoelectric module and including a processor and a memory that includes instructions operable, when executed by the processor, to perform operations including determining a cooling load of the cooling coil; and based on the determined cooling load, adjusting one or both of the control valve or the thermoelectric module to adjust a characteristic of the flow of the cooling liquid.

In a first aspect combinable with the general implementation, adjusting one or both of the control valve or the thermoelectric module includes adjusting the thermoelectric module.

A second aspect combinable with any of the previous aspects further includes adjusting a temperature of the flow of the cooling liquid circulated from the thermoelectric module to the cooling coil in the cooling liquid supply piping system.

In a third aspect combinable with any of the previous aspects, adjusting the thermoelectric module includes adjusting a power input to the thermoelectric module to adjust an amount of heat transferred from the cooling liquid circulated in the cooling liquid supply piping system, to a hot side of the thermoelectric module, through a cold side of the thermoelectric module.

In a fourth aspect combinable with any of the previous aspects, the thermoelectric module further includes a heat sink thermally coupled to the hot side of the thermoelectric module.

In a fifth aspect combinable with any of the previous aspects, the heat sink includes one or both of a heated flow of the cooling liquid circulated through the cooling liquid return piping system from the cooling coil, or a heat transfer material coupled to the hot side of the thermoelectric module.

In a sixth aspect combinable with any of the previous aspects, adjusting one or both of the control valve or the thermoelectric module includes adjusting the control valve.

In a seventh aspect combinable with any of the previous aspects, the operations further include adjusting a flow rate of the flow of the cooling liquid circulated to the cooling coil in the cooling liquid supply piping system.

In an eighth aspect combinable with any of the previous aspects, the operations further include determining a rate of change of the cooling load over a particular time duration; and selecting, for adjustment, the thermoelectric module or the control valve based at least in part on the determined rate of change of the cooling load.

Various implementations of systems and methods for cooling of a data center with a cooling module according to the present disclosure can include one or more of the following advantages. For example, the cooling systems and methods may enable faster, easier, and more reliable cooling than valves, particularly for high frequency thermal disturbances. As another example, the cooling systems and methods may integrate both a thermoelectric module and/or a phase change material for fast and stable cooling and a control valve for large capacity and efficient cooling, which may provide cost-efficient and high granularity thermal control without many valves. Also, the cooling systems and methods can be actuated with different control systems than valves and be widely integrated in different cooling systems. Further, the cooling systems and methods can be widely used in various platforms, e.g., for consumer or industrial power electronics cooling, for tray level water control granularity, or where fluid flow and chiller capacity is insufficient for peak loads. As another example, a data center cooling system that includes a cooling module may be sized (e.g., cooling capacity) more accurately relative to a estimated cooling load rather than oversized, as additional cooling (e.g., beyond a capacity of the system) may be provided by the cooling module. As another example, mechanical or electromechanical control systems for a cooling system that includes a cooling module according to the present disclosure may provide for additional degrees of freedom to adjust for different frequency thermal disturbances, as well as add redundancy for the different systems.

These general and specific aspects can be implemented using a device, system or method, or any combinations of devices, systems, or methods. The details of one or more implementations are set forth in the accompanying drawings and the description below. Other features, objects, and advantages will be apparent from the description and drawings, and from the claims.

DETAILED DESCRIPTION

This disclosure relates to cooling systems and methods for cooling of data centers. In one aspect, a cooling system includes a supply conduit, a return conduit, and a heat transfer module. A flow of a cooling liquid is circulated from a cooling plant through the supply conduit and the heat transfer module toward a heat exchanger. The cooling fluid heated by the heat exchanger is circulated through the return conduit toward the cooling plant. The heat transfer module is thermally coupled to the supply and return conduits and configured to fast cool the cooling liquid supplied to the heat exchanger by increasing a heat transfer rate from a cold side to a warm side of the heat transfer module. The cold side is thermally coupled to the supply conduit and transfers heat from the flow of the cooling fluid in the supply conduit to the warm side. The warm side includes a heat sink that is thermally coupled to the cooling liquid return conduit. The cooling system can include a control valve fluidly coupled to the supply conduit or the return conduit and configured to modulate a flow rate of the cooling liquid supplied to the heat exchanger and thereby change the temperature of the cooling liquid. A control system can determine a cooling load of the heat exchanger and select at least one of the heat transfer module and the control valve to adjust based on the determined cooling load.

Figure 1:
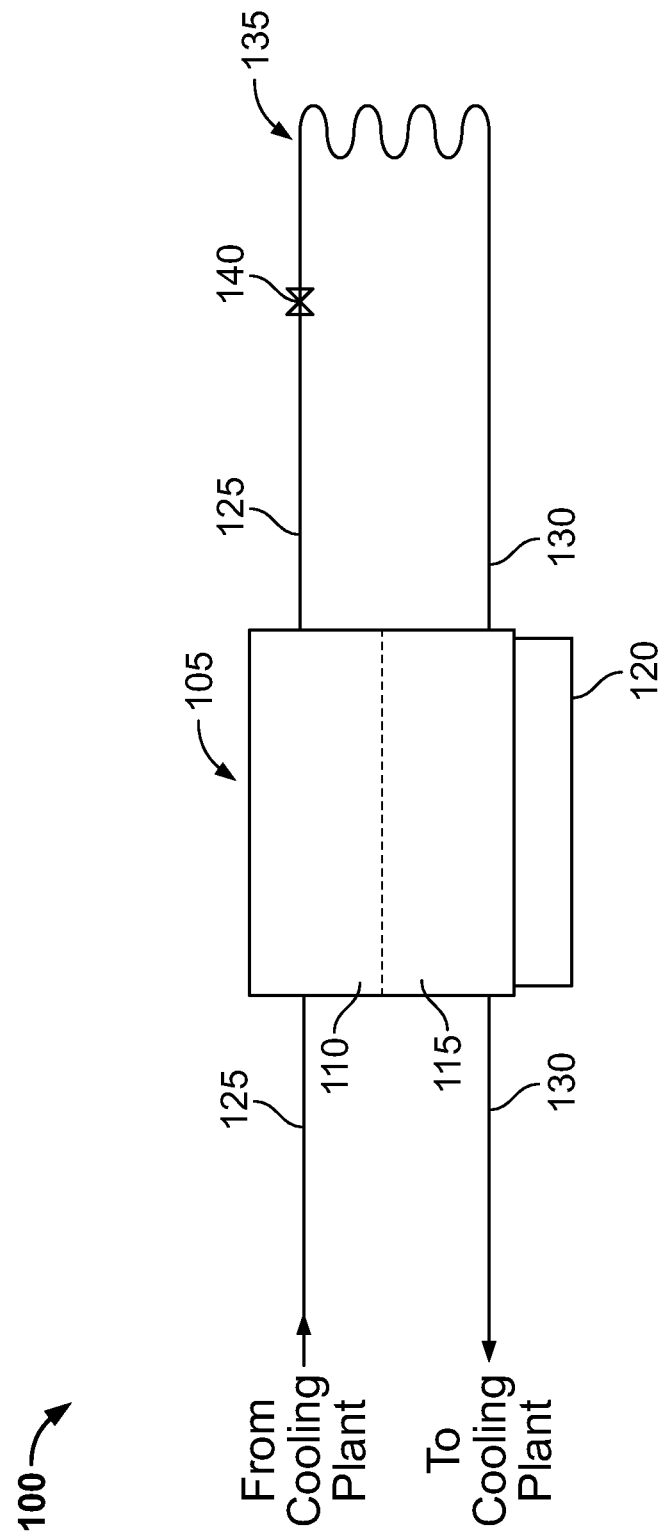
FIG. 1 illustrates a cooling module for cooling of a data center.

FIG. 1 illustrates an exemplary cooling module 100 for cooling of a data center. The data center can be a data center exemplified in FIG. 2, FIG. 3, FIG. 4, or FIG. 5. The cooling module 100 can be included, e.g., integrated, in a data center cooling system of the data center and provide, in some examples, cooling to the data center along with cooling provided by, for example, one or more heat exchangers such as cooling coils.

As illustrated, the cooling module 100 includes a cooling liquid supply conduit 125, a cooling liquid return conduit 130, and a heat transfer module 105. The cooling liquid supply conduit 125 is fluidly coupled between a cooling plant and a heat exchanger 135. The cooling liquid return conduit 130 is fluidly coupled between the heat exchanger 135 and the cooling plant. The cooling liquid supply conduit 125 and the cooling liquid return conduit 130 can each include a cooling liquid piping system. The cooling plant can be chilled fluid from a chiller plant, free cooling facility, or other mechanical refrigeration device, chilled glycol, an evaporatively-cooled fluid, cool fluid from a body of water, refrigerant liquid, or otherwise. In a particular example, the cooling plant is a chillerless (or compressorless) cooling plant (e.g., does not use mechanical refrigeration).

The heat exchanger 135 is positioned to receive a heated airflow from one or more racks in the data center. At least one rack supports a number of heat-generating electronic devices, e.g., computers, servers, processors, uninterruptible power supplies, and/or other devices. The heat exchanger 135 can include an air-to-liquid heat exchanger. In a particular example, the heat exchanger 135 includes one or more cooling coils or cooling plates.

The heat transfer module 105 is thermally coupled between the cooling plant and the heat exchanger 135. The heat transfer module 105 can cool a flow of a cooling liquid in the cooling liquid supply conduit 125 circulated from the cooling plant to the heat exchanger 135, and thus decrease a temperature of the cooling liquid. The heat transfer module 105 can be configured to cool the cooling liquid at a cooling rate more than one order of magnitude faster than valves, e.g., mechanical valves.

The heat transfer module 105 includes a cold side 110 and a warm side 115. The cold side 110 can be thermally coupled to the cooling liquid supply conduit 125 and configured to transfer heat from the flow of the cooling liquid in the cooling liquid supply conduit 125 to the warm side 115. In some examples, the cold side 110 is coupled to the cooling liquid supply conduit 125 by using a thermally conductive material between a surface of the cold side and a surface of the cooling liquid supply conduit 125. In some examples, the cold side 110 includes an input to receive the flow of the cooling liquid from the cooling plant and an output to supply the cooled flow of cooling liquid to the heat exchanger 135.

In some examples, the heat transfer module 105 includes a thermoelectric cooling (TEC) module, e.g., a Peltier cooler. The TEC module includes a power input to receive electrical power, e.g., a supply voltage, for controlling a difference in temperature between the cold side 110 and the warm side 115. Increasing or decreasing the electrical power for the TEC module can increase or decrease the temperature difference, thereby correspondingly increasing or decreasing the heat transfer rate from the cold side 110 to the warm side 115.

The warm side 115 of the heat transfer module 105 can be a heat sink to dissipate heat, e.g., the heat transferred from the cold side 110 to the warm side 115. Increasing heat dissipation by the heat sink can increase a temperature of the warm side 115 and increase the heat transfer rate from the cold side 110 to the warm side 115, which consequently increases the cooling rate of the heat transfer module 105. The heat sink can be thermally coupled to the cooling liquid return conduit 130, e.g., by using a thermally conductive material.

In some implementations, a second heat sink 120 is thermally coupled to the heat sink of the warm side 115, e.g., by using a thermally conductive material or by being directly attached to. The second heat sink 120 is configured to further increase heat dissipation from the warm side 115 and thus increase the cooling rate of the heat transfer module 105. In some examples, the second heat sink 120 includes a phase change material (PCM), e.g., a solid-liquid PCM. The PCM can include organic PCM material, inorganic PCM material, eutectics material, or hygroscopic material.

As the PCM absorbs heat, a temperature of the PCM increases. When the PCM reaches a melting temperature at which the PCM material changes from solid phase to liquid phase, the PCM can absorb large amounts of heat at a substantially constant temperature. The PCM can continue to absorb heat without a significant rise in temperature until all the PCM material is transformed to the liquid phase. The PCM can be configured to work in a temperature range. The heat sink of the warm side 115 can be configured to work in a temperature range including the phase change (e.g., melting) temperature of the PCM.

In some examples, the heat transfer module 105 is configured to transfer a certain amount of heat from a flow of a cooling liquid so that the cooled cooling liquid can cool a cooling load of the heat exchanger 135. The PCM in the second heat sink 120 can be sized to store a maximum of the certain amount of heat from the heat transfer module 105. In some examples, when a temperature of a surrounding medium around the PCM decreases, e.g., below the melting temperature, the PCM solidifies from the liquid phase to the solid phase, releasing the stored heat, e.g., for next use.

The output of the cold side 110 supplies the cooled flow of cooling liquid to the heat exchanger 135. The heat exchanger 135 receives a heated airflow from the racks in the data center and exchanges heat from the heated airflow to the cooled flow of cooling liquid. The heated flow of cooling liquid is circulated into the cooling liquid return conduit 130 that is fluidly coupled between the heat exchanger 135 and the cooling plant. The heated flow of cooling liquid can be circulated from the heat exchanger 135 to the cooling plant through the cooling liquid return conduit 130. The warm side 115 can be thermally coupled to the cooling liquid return conduit 130. In some examples, the warm side 115 includes an input to receive the heated flow of the cooling liquid from the heat exchanger 135 and an output to supply the heated flow of the cooling liquid to the cooling plant.

In some implementations, the cooling module 100 includes a control valve 140. The control valve 140 is configured to modulate a flow rate of the cooling liquid supplied to the heat exchanger 135, thereby controlling a cooling rate for a cooling load of the heat exchanger 135. The control value 140 can be fluidly coupled to one of the cooling liquid supply conduit 125 (as shown) or, in an alternate implementation, to the cooling liquid return conduit 130 at any suitable location, e.g., before the heat exchanger 135, after the heat exchanger 135, before the heat transfer module 105, or after the heat transfer module 105. In some examples, the control valve 140 is a three-way valve fluidly coupled to the cooling liquid supply conduit 125 and/or the cooling liquid return conduit 130.

An opening or closing of the control valve 140 can be controlled by electrical, hydraulic, or pneumatic actuators, e.g., based on an electric or pneumatic signal. The control valve 140 can be controlled to be partially opened, e.g., with 20% opening, 50% opening, or 100% opening, to adjust a flow rate of the cooling liquid. In some examples, the cooling module 100 includes one or more control valves 140. The control valves 140 can work together to adjust the flow rate of the cooling liquid with a higher granularity than a single control valve 140.

As noted above, the heat exchanger 135 is coupled to a thermal system, e.g., one or more racks in the data center that support a number of heat-generating electronic devices. The heat exchanger 135 receives a cooled flow of cooling liquid to control a temperature of the thermal system. The heat transfer module 105 cools the cooling liquid provided to the heat exchanger 135 to decrease a temperature of the cooling liquid thus to cool the thermal system. The control valve 140 increases a flow rate of the cooling liquid provided to the heat exchanger 135 thus to cool the thermal system. In some examples, the heat transfer module 105 provides a faster cooling rate for the thermal system than the control valve 140, e.g., by more than one order of magnitude. In some examples, the control valve 140 provides larger cooling capacity than the heat transfer module 105 for the thermal system.

The heat transfer module 105 can be used for higher frequency temperature disturbances from the thermal system. For example, transients in an input heat load, e.g., from a server in the data center, cause the thermal system to exceed a temperature threshold over short periods, which requires fast cooling of the thermal system. The control valve 140 can be used for lower frequency temperature disturbances from the thermal system. For example, the temperature of the thermal system is gradually increased over time. In some examples, the heat transfer module 105 and the control valve 140 are used together for controlling the temperature of the thermal system.

In some implementations, the cooling module 100 includes a control system communicably coupled to the heat transfer module 105 and the control valve 140. In some other implementations, the control system is external to the cooling module 100 and/or integrated in a central control system of the data center. The control system is configured to control at least one of the heat transfer module 105 or the control valve 140. The control system can also include a feedback system to monitor and adjust the controlling of the heat transfer module 105 and/or the control valve 140.

The control system can be configured to determine a cooling load of the heat exchanger 135 in the data center, e.g., based on temperature information from temperature sensors and/or the data center. Based on the determined cooling load, the control system can select at least one of the heat transfer module 105 or the control valve 140 to adjust. In some examples, the control system can predict a cooling load and determine a difference between a predicated cooling load and a present cooling load. Based on the determined difference, the control system can select at least one of the heat transfer module 105 or the control valve 140 to adjust. In some examples, the control system determines a rate of change of the cooling load over a particular time duration and selects at least one of the heat transfer module 105 or the control valve 140 to adjust.

In some examples, e.g., for higher frequency temperature disturbances on the cooling load, the control system selects the heat transfer module 105 and adjusts the heat transfer module 105 to increase a heat transfer rate from the cold side 110 to the warm side 115 and/or to the second heat sink 120, e.g., by increasing the input supply voltage. In some examples, e.g., for lower frequency and larger capacity temperature disturbances on the cooling load, the control system selects the control valve 140 and modulates the control valve to adjust the flow rate of the cooling liquid to the heat exchanger 135. In some examples, the control system selects to adjust both the heat transfer module 105 and the control valve 140 to control the cooling load.

In some example implementations of a data center cooling system (such as the example systems shown in FIGS. 2-5), cooling modules such as cooling modules 100 may be used to help control a temperature of a cooling fluid routed to cool heat generating electronic devices (e.g., rack mounted server and networking devices). In some instances, there may be a one to one ratio between a cooling module 100 and a particular group of devices (e.g., a single device, a server tray with multiple devices, a rack with multiple server trays, a group of racks, or otherwise). In some instances, more than one cooling module 100 may be used to serve a particular group of devices (e.g., a single device, a server tray with multiple devices, a rack with multiple server trays, a group of racks, or otherwise). For example, multiple heat transfer modules 105 may be positioned in series on supply and return fluid conduits to provide for various levels of cooling granularity by, for example, alternating operation and/or series operation of the heat transfer modules 105. As another example, heat transfer modules 105 of various sizes (e.g., various cooling power capacities) may be positioned in parallel to provide for multiple cooling levels.

Figure 2:
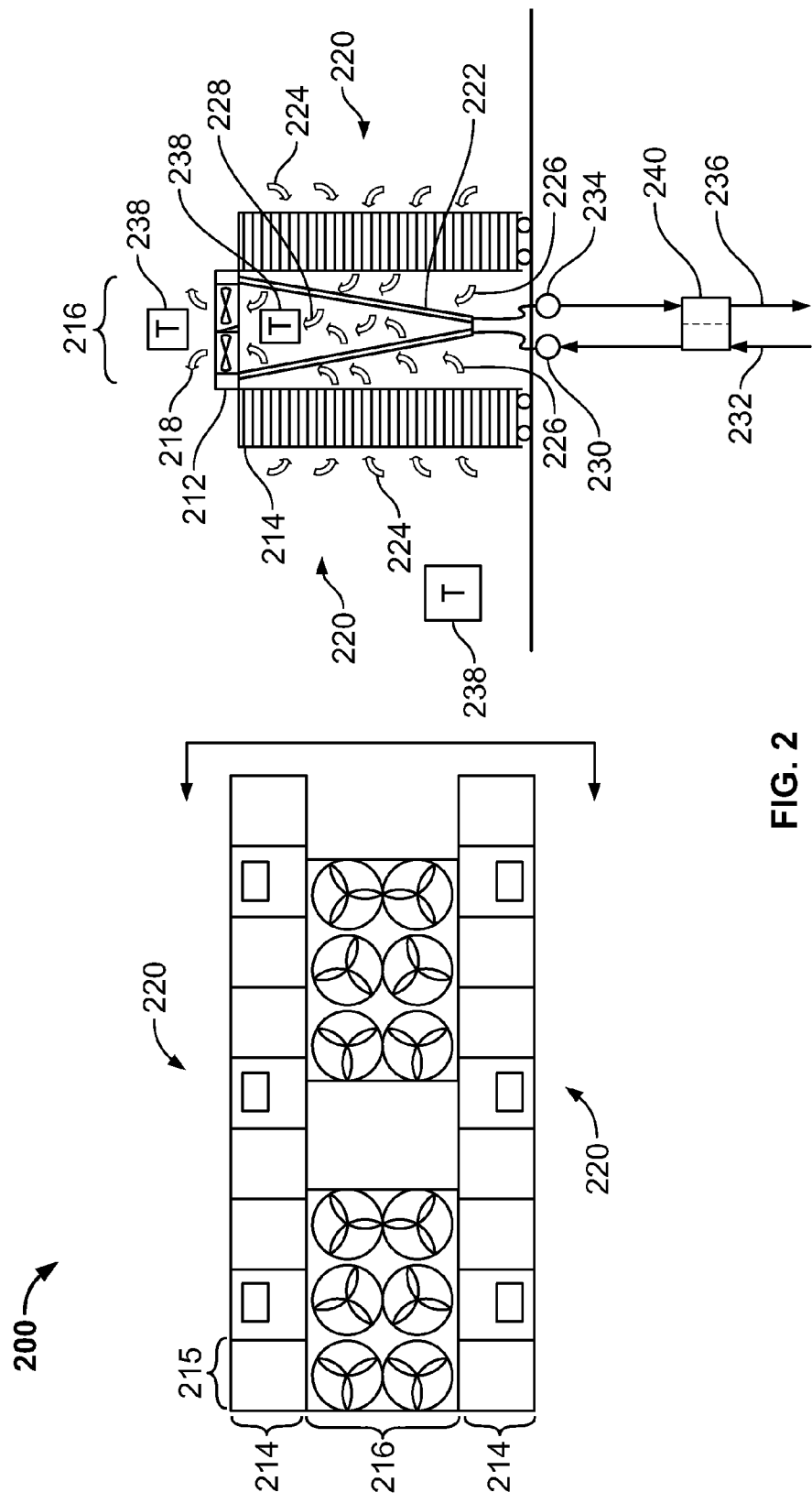
FIG. 2 illustrates a schematic diagram showing an example implementation of a data center cooling system that includes a cooling module for cooling of a data center.

FIG. 2 illustrates a top and side view of an example implementation of a data center 200 that includes a cooling system 216. The cooling system 216 includes a cooling module 240 for cooling of the data center 200. The cooling module 240 can be the same as or similar to the cooling module 100 of FIG. 1.

As illustrated, the data center 200 includes one or more rows 214 of computers that are supported in racks 215. The rows 214 are arranged substantially parallel with each other, and are each adjacent to aisles in a human-occupiable workspace 220. The computers that are supported in the racks 215, in some implementations, may be open to the human-occupiable workspace 220 such that an airflow may be circulated from the workspace 220 through the racks 216 during normal operation of the system, and so that technicians may access particular devices without having to substantially interfere with airflow over the other devices (such as would happen if the rack were sealed and the technician had to open a door to access one of the devices).

Data center 200 also includes one or more cooling units 216 arranged between adjacent pairs of the rows 214 of racks 215. The cooling units 216 are modular (and each is of like size), and the rows of racks "back up to" the cooling units 216 so that warmed air from the racks passes directly into the cooling units 216. As illustrated, each cooling unit 216 includes a number of fans 212 (e.g., six as illustrated) that are arranged to circulate air from the workspace 220, through the racks 215 arranged in the rows 214.

The ambient air 224 is circulated through the racks 215 and heated by heat generating electronic devices (e.g., servers, processors, uninterruptible power supplies, and other devices) into heated airflow 226. The heated airflow 226 is circulated through one or more cooling coils 222 of the cooling unit 216 to a cooling airflow 228. The cooling airflow 228 is then circulated by the fans 212 to the workspace 220 as a leaving airflow 218 from the cooling units 216. In some implementations, a temperature of the cooling airflow 228 and the leaving airflow 218 may be substantially the same (e.g., where there is no electrical equipment or mixing with other air between the two). In some implementations, alternatively, the leaving airflow 218 may be slightly warmer than the cooling airflow 228 to account for, e.g., motor heat from fan motors (not shown) that drive the fans 212.

As illustrated, therefore, a volume defined between two substantially parallel rows 214 of racks 215 into which one or more cooling units 216 may be disposed may include one or more warm air plenums and one or more cool air plenums. For example, the warm air plenums may be defined by spaces into which the heated airflows 226 are circulated by the fans 212. The cool air plenums may be defined by spaces into which the cooling airflow 228 is circulated. Thus the cooling coils 222 may thermally separate the warm air plenums from the cool air plenums between the rows 214 of racks 215.

A cooling fluid supply 232 (e.g., chilled water, chilled glycol, condenser water, and/or a mix of one of more fluid flows) is circulated (e.g., pumped) to the cooling coils 222 through a cooling fluid supply conduit 230. After circulating through the cooling coils 222 so that heat from the heated airflow 226 is transferred to the cooling fluid supply 232, cooling fluid return 236 (e.g., the cooling fluid supply 232 leaving the cooling coils 222) is circulated from the cooling coils 222 and, for example, to a central cooling facility, via a cooling fluid return conduit 234. Although illustrated as arranged underneath a floor on which the rows 214 of racks 215 and the cooling units 216 are supported, the conduits 230 and/or 234 may be arranged in the workspace 220, above the cooling units 216, and/or in a separate overhead plenum.

The illustrated system also includes one or more temperature sensors 238. For example, as illustrated, a temperature sensor 238 can be positioned in one or more locations to measure the temperature of the leaving airflow 218 from the cooling units 216. In some implementations, a temperature of the cooling airflow 228, the leaving airflow 218, and the ambient airflow 224 of the workspace 220 can be substantially similar and/or equal. Thus, measuring any one of the temperatures of these airflows can at least approximate a leaving air temperature of the cooling units 216.

As illustrated, the cooling units 216 includes the cooling module 240 that is coupled to the cooling fluid supply conduit 230 and the cooling fluid return conduit 234 and configured to control a temperature and/or a flow rate of the cooling liquid provided to the cooling coils 222. In some implementations, the cooling module 240 includes a heat transfer module, e.g., the heat transfer module 105 of FIG. 1. The heat transfer module can be thermally coupled to the cooling fluid supply conduit 230 and the cooling fluid return conduit 234 between the cooling fluid supply 232 and the cooling coils 222. The heat transfer module can cool a flow of the cooling liquid in the cooling fluid supply conduit 230 circulated from the cooling fluid supply 232 to the cooling coils 222. The heat transfer module can include a thermoelectric cooling (TEC) module. By controlling electrical power supplied to the TEC module, a heat transfer rate from a cold side of the heat transfer module that is thermally coupled to the cooling liquid supply conduit 230 to a warm side of the heat transfer module.

The warm side of the heat transfer module can include a heat sink to dissipate heat. The heat sink can be thermally coupled to the cooling liquid return conduit 234. A second heat sink, e.g., a phase changer material (PCM), can be thermally coupled or thermally attached to the heat sink to further increase heat dissipation, increase the heat transfer rate and thus reduce the temperature of the cooling liquid. The heat transfer module can cool the cooling liquid at a cooling rate faster than valves, e.g., by more than one order of magnitude.

In some implementations, the cooling module 240 includes a control valve, e.g., the control valve 140 of FIG.

1. The control valve can be fluidly coupled to one of the cooling liquid supply conduit 230 or the cooling liquid return conduit 234 and configured to modulate the flow rate of the cooling liquid supplied to the cooling coils 222. In some examples, the control valve is controlled to be partially opened to adjust the flow rate of the cooling liquid.

The cooling module 240 can include a control system, e.g., the control system of FIG. 1, to control the heat transfer module and/or the control valve. The control system can be configured to determine a cooling load or a difference between a predicated cooling load and a present cooling load, e.g., based on temperature information from the temperature sensors 238. Based on the determined cooling load or the determined difference, the control system can select at least one of the heat transfer module or the control valve to adjust the temperature and/or the flow rate of the cooling liquid.

In operation, the cooling units 216 may be controlled (e.g., via one or more individual controllers and/or a main controller in the data center) to maintain a specified approach temperature. The control system of the cooling module 240 can be integrated in a controller for the cooling units 216.

In some examples, transients in the cooling load may cause the racks 215 to exceed a temperature threshold over short periods. The cooling fluid control valve can have a slow response time and cannot reduce the temperature of the racks 215 under the temperature threshold by just increasing the flow rate of the control valve. Based on the determined cooling load, the control system of the cooling module 240 can select to increase the supplied electric power of the heat transfer module to increase the heat transfer rate and thus to quickly reduce the temperature of the cooling liquid. Concurrently the control system can also modulate the control valve to increase the flow rate of the cooling liquid.

Figure 3:
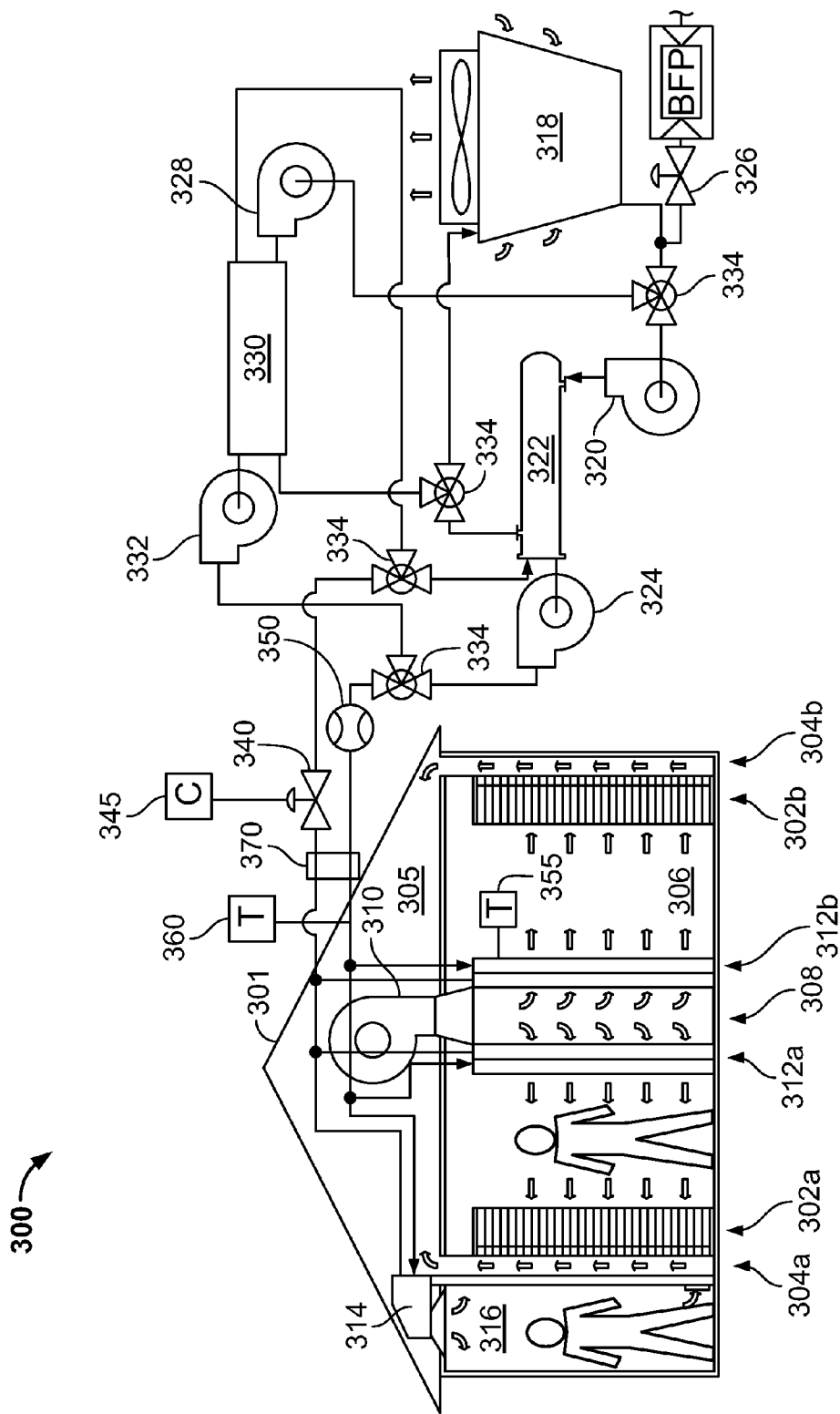
FIG. 3 illustrates a schematic diagram showing another example implementation of a data center cooling system that includes a cooling module for cooling of a data center.

FIG. 3 illustrates a schematic diagram showing another example implementation of a data center cooling system 300 for cooling a computer data center 301, which as shown, is a building that houses a large number of computers or similar heat-generating electronic components. The cooling system 300 includes a cooling module 370 for cooling of the data center 301. The cooling module 370 can be the same as or similar to the cooling module 100 of FIG. 1 or the cooling module 240 of FIG. 2.

In some implementations, the cooling system 300 may implement static approach control and/or dynamic approach control to, for example, control an amount of cooling fluid circulated to cooling modules (such as cooling coils 312a and 312b). A workspace 306 is defined around the computers, which are arranged in a number of parallel rows and mounted in vertical racks, such as racks 302a, 302b. The racks may include pairs of vertical rails to which are attached paired mounting brackets. Trays containing computers, such as standard circuit boards in the form of motherboards, may be placed on the mounting brackets.

In one example, the mounting brackets may be angled rails welded or otherwise adhered to vertical rails in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Air may circulate from workspace 306 across the trays and into warm-air plenums 304a, 304b behind the trays. The air may be drawn into the trays by fans mounted at the back of the trays. The fans may be programmed or otherwise configured to maintain a set exhaust temperature for the air into the warm air plenum, and may also be programmed or otherwise configured to maintain a particular temperature rise across the trays. Where the temperature of the air in the work space 306 is known, controlling the exhaust temperature also indirectly controls the temperature rise. The work space 306 may, in certain circumstances, be referenced as a "cold aisle," and the plenums 304a, 304b as "warm aisles."

The temperature rise can be large. For example, the work space 306 temperature may be about 77° F. (25° C.) and the exhaust temperature into the warm-air plenums 304a, 304b may be set to 113° F. (45° C.), for a 36° F. (20° C.)) rise in temperature. The exhaust temperature may also be as much as 212° F. (100° C.) where the heat generating equipment can operate at such elevated temperature. For example, the temperature of the air exiting the equipment and entering the warm-air plenum may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.). In some implementations, the work space 306 may experience a transient high temperature for a short period of time. Such a high exhaust temperature generally runs contrary to teachings that cooling of heat-generating electronic equipment is best conducted by washing the equipment with large amounts of fast-moving, cool air. Such a cool-air approach does cool the equipment, but it also uses lots of energy.

Cooling of particular electronic equipment, such as microprocessors, can be improved even where the flow of air across the trays is slow, by attaching impingement fans to the tops of the microprocessors or other particularly warm components, or by providing heat pipes and related heat exchangers for such components.

The heated air can be routed upward into a ceiling area, or attic 305, or into a raised floor or basement, or other appropriate space, and can be gathered there by air handling units that include, for example, fan 310, which can include, for example, one or more centrifugal fans appropriately sized for the task. The fan 310 can then deliver the air back into a plenum 308 located adjacent to the workspace 306. The plenum 308 can be simply a bay-sized area in the middle of a row of racks, that has been left empty of racks, and that has been isolated from any warm-air plenums on either side of it, and from cold-air work space 306 on its other sides. Alternatively, air can be cooled by coils defining a border of warm-air plenums 304a, 304b and expelled directly into workspace 306, such as at the tops of warm-air plenums 304a, 304b.

Cooling coils 312a, 312b can be located on opposed sides of the plenum approximately flush with the fronts of the racks. (The racks in the same row as the plenum 308, coming in and out of the page in the figure, are not shown.) The coils can have a large surface area and be very thin so as to present a low pressure drop to the system 300. In this way, slower, smaller, and quieter fans can be used to drive air through the system. Protective structures such as louvers or wire mesh can be placed in front of the coils 312a, 312b to prevent them from being damaged.

In operation, fan 310 pushes air down into plenum 308, causing increased pressure in plenum 308 to push air out through cooling coils 312a, 312b. As the air passes through the coils 312a, 312b, its heat is transferred into the water in the coils 312a, 312b, and the air is cooled.

The speed of the fan 310 and/or the flow rate or temperature of cooling water flowing in the cooling coils 312a, 312b may be controlled in response to measured values. For example, the pumps driving the cooling liquid may be variable speed pumps that are controlled to maintain a particular temperature in work space 306. Such control mechanisms may be used to maintain a constant temperature in workspace 306 or plenums 304a, 304b and attic 305.

The workspace 306 air may then be drawn into racks 302a, 302b such as by fans mounted on the many trays that are mounted in racks 302a, 302b. This air may be heated as it passes over the trays and through power supplies running the computers on the trays, and may then enter the warm-air plenums 304a, 304b. Each tray may have its own power supply and fan, with the power supply at the back edge of the tray, and the fan attached to the back of the power supply. All of the fans may be configured or programmed to deliver air at a single common temperature, such as at a set 113° F. (45° C.). The process may then be continuously readjusted as fan 110 captures and circulates the warm air.

Additional items may also be cooled using system 300. For example, room 316 is provided with a self-contained fan coil unit 314 which contains a fan and a cooling coil. The unit 314 may operate, for example, in response to a thermostat provided in room 316. Room 316 may be, for example, an office or other workspace ancillary to the main portions of the data center 301.

Fresh air may be provided to the workspace 306 by various mechanisms. For example, a supplemental air-conditioning unit (not shown), such as a standard roof-top unit, may be provided to supply necessary exchanges of outside air. Also, such a unit may serve to dehumidify the workspace 306 for the limited latent loads in the system 300, such as human perspiration. Alternatively, louvers may be provided from the outside environment to the system 300, such as powered louvers to connect to the warm air plenum 304b. System 300 may be controlled to draw air through the plenums when environmental (outside) ambient humidity and temperature are sufficiently low to permit cooling with outside air. Such louvers may also be ducted to fan 310, and warm air in plenums 304a, 304b may simply be exhausted to atmosphere, so that the outside air does not mix with, and get diluted by, the warm air from the computers. Appropriate filtration may also be provided in the system, particularly where outside air is used.

Also, the workspace 306 may include heat loads other than the trays, such as from people in the space and lighting. Where the volume of air passing through the various racks is very high and picks up a very large thermal load from multiple computers, the small additional load from other sources may be negligible, apart from perhaps a small latent heat load caused by workers, which may be removed by a smaller auxiliary air conditioning unit as described above.

Cooling water may be provided from a cooling water circuit powered by pump 324. The cooling water circuit may be formed as a direct-return, or indirect-return, circuit, and may generally be a closed-loop system. Pump 324 may take any appropriate form, such as a standard centrifugal pump. Heat exchanger 322 may remove heat from the cooling water in the circuit. Heat exchanger 322 may take any appropriate form, such as a plate-and-frame heat exchanger or a shell-and-tube heat exchanger.

Heat may be passed from the cooling water circuit to a condenser water circuit that includes heat exchanger 322, pump 320, and cooling tower 318. Pump 320 may also take any appropriate form, such as a centrifugal pump. Cooling tower 318 may be, for example, one or more forced draft towers or induced draft towers. The cooling tower 318 may be considered a free cooling source, because it requires power only for movement of the water in the system and in some implementations the powering of a fan to cause evaporation; it does not require operation of a compressor in a chiller or similar structure.

The cooling tower 318 may take a variety of forms, including as a hybrid cooling tower. Such a tower may combine both the evaporative cooling structures of a cooling tower with a water-to-water heat exchanger. As a result, such a tower may be fit in a smaller face and be operated more modularly than a standard cooling tower with separate heat exchanger. Additional advantage may be that hybrid towers may be run dry, as discussed above. In addition, hybrid towers may also better avoid the creation of water plumes that may be viewed negatively by neighbors of a facility.

As shown, the fluid circuits may create an indirect water-side economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 322, and routing cooling tower water (condenser water) directly to cooling coils 312a, 312b (not shown). Such an implementation may be more efficient, as it removes one heat exchanging step. However, such an implementation also causes water from the cooling tower 318 to be introduced into what would otherwise be a closed system. As a result, the system in such an implementation may be filled with water that may contain bacteria, algae, and atmospheric contaminants, and may also be filled with other contaminants in the water. A hybrid tower, as discussed above, may provide similar benefits without the same detriments.

Control valve 326 is provided in the condenser water circuit to supply make-up water to the circuit. Make-up water may generally be needed because cooling tower 318 operates by evaporating large amounts of water from the circuit. The control valve 326 may be tied to a water level sensor in cooling tower 318, or to a basin shared by multiple cooling towers. When the water falls below a predetermined level, control valve 326 may be caused to open and supply additional makeup water to the circuit. A back-flow preventer (BFP) may also be provided in the make-up water line to prevent flow of water back from cooling tower 318 to a main water system, which may cause contamination of such a water system.

Optionally, a separate chiller circuit may be provided. Operation of system 300 may switch partially or entirely to this circuit during times of extreme atmospheric ambient (e.g., hot and humid) conditions or times of high heat load in the data center 301. Controlled mixing valves 334 are provided for electronically switching to the chiller circuit, or for blending cooling from the chiller circuit with cooling from the condenser circuit. Pump 328 may supply tower water to chiller 330, and pump 332 may supply chilled water, or cooling water, from chiller 330 to the remainder of system 300. Chiller 330 may take any appropriate form, such as a centrifugal, reciprocating, or screw chiller, or an absorption chiller.

The chiller circuit may be controlled to provide various appropriate temperatures for cooling water. In some implementations, the chilled water may be supplied exclusively to a cooling coil, while in others, the chilled water may be mixed, or blended, with water from heat exchanger 322, with common return water from a cooling coil to both structures. The chilled water may be supplied from chiller 330 at temperatures elevated from typical chilled water temperatures. For example, the chilled water may be supplied at temperatures of 55° F. (13° C.) to 65 to 70° F. (18 to 21° C.) or higher. The water may then be returned at temperatures like those discussed below, such as 59 to 176° F. (15 to 80° C.). In this approach that uses sources in addition to, or as an alternative to, free cooling, increases in the supply temperature of the chilled water can also result in substantial efficiency improvements for the system 300.

Pumps 320, 324, 328, 332, may be provided with variable speed drives. Such drives may be electronically controlled by a central control system to change the amount of water pumped by each pump in response to changing set points or changing conditions in the system 300. For example, pump 324 may be controlled to maintain a particular temperature in workspace 306, such as in response to signals from a thermostat or other sensor in workspace 306.

In operation, system 300 may respond to signals from various sensors placed in the system 300. The sensors may include, for example, thermostats, humidistats, flowmeters, and other similar sensors. In one implementation, one or more thermostats may be provided in warm air plenums 304a, 304b, and one or more thermostats may be placed in workspace 306. In addition, air pressure sensors may be located in workspace 306, and in warm air plenums 304a, 304b. The thermostats may be used to control the speed of associated pumps, so that if temperature begins to rise, the pumps turn faster to provide additional cooling waters. Thermostats may also be used to control the speed of various items such as fan 310 to maintain a set pressure differential between two spaces, such as attic 305 and workspace 306, and to thereby maintain a consistent airflow rate. Where mechanisms for increasing cooling, such as speeding the operation of pumps, are no longer capable of keeping up with increasing loads, a control system may activate chiller 330 and associated pumps 328, 332, and may modulate control valves 334 accordingly to provide additional cooling.

Various values for temperature of the fluids in system 300 may be used in the operation of system 300. In one exemplary implementation, the temperature set point in warm air plenums 304a, 304b may be selected to be at or near a maximum exit temperature for trays in racks 302a, 302b. This maximum temperature may be selected, for example, to be a known failure temperature or a maximum specified operating temperature for components in the trays, or may be a specified amount below such a known failure or specified operating temperature. In certain implementations, a temperature of 45° C. may be selected. In other implementations, temperatures of 25° C. to 125° C. may be selected. Higher temperatures may be particularly appropriate where alternative materials are used in the components of the computers in the data center, such as high temperature gate oxides and the like.

In one implementation, supply temperatures for cooling water may be 68° F. (20° C.), while return temperatures may be 104° F. (40° C.). In other implementations, temperatures of 50° F. to 84.20° F. or 104° F. (10° C. to 29° C. or 40° C.) may be selected for supply water, and 59° F. to 176° F. (15° C. to 80° C.) for return water. Chilled water temperatures may be produced at much lower levels according to the specifications for the particular selected chiller. Cooling tower water supply temperatures may be generally slightly above the wet bulb temperature under ambient atmospheric conditions, while cooling tower return water temperatures will depend on the operation of the system 300.

In certain implementations, the entering water temperature may be 64° F. (18° C.) and the exiting air temperature 77° F. (25° C.), as noted above, for an approach temperature of 12.6° F. (7° C.). In other implementations, wider or narrower approach temperature may be selected based on economic considerations for an overall facility.

As illustrated, the system 300 also includes a control valve 340 and a controller 345 operable to modulate the valve 340 in response to or to maintain, for example, an approach temperature set point of the cooling coils 312a and 312b. For example, an airflow temperature sensor 355 may be positioned at a leaving face of one or both of the cooling coils 312a and 312b. The temperature sensor 355 may thus measure a leaving air temperature from the cooling coils 312a and/or 312b. A temperature sensor 360 may also be positioned in a fluid conduit that circulates the cooling water to the cooling coils 312a and 312b (as well as fan coil 314).

Controller 345, as illustrated, may receive temperature information from one or both of the temperature sensors 355 and 360. In some implementations, the controller 345 may be a main controller (e.g., processor-based electronic device or other electronic controller) of the cooling system of the data center, which is communicably coupled to each control valve (such as control valve 340) of the data center and/or individual controllers associated with the control valves. For example, the main controller may be a master controller communicably coupled to slave controllers at the respective control valves. In some implementations, the controller 345 may be a Proportional-Integral-Derivative (PID) controller. Alternatively, other control schemes, such as PI or otherwise, may be utilized.

As another example, the control scheme may be implemented by a controller utilizing a state space scheme (e.g., a time-domain control scheme) representing a mathematical model of a physical system as a set of input, output and state variables related by first-order differential equations. In some example implementations, the controller 345 (or other controllers described herein) may be a programmable logic controller (PLC), a computing device (e.g., desktop, laptop, tablet, mobile computing device, server or otherwise), or other form of controller. In cases in which a controller may control a fan motor, for instance, the controller may be a circuit breaker or fused disconnect (e.g., for on/off control), a two-speed fan controller or rheostat, or a variable frequency drive.

As illustrated, the system 300 includes the cooling module 370 coupled to the fluid conduit that circulates the cooling water to the cooling coils 312a and 312b. The cooling module 370 is configured to provide supplemental control of a temperature and/or a flow rate of the cooling water provided to the cooling coils 312a and 312b, particularly for transient increases in a cooling load of the cooling coils 312a and 312b in the data center 301.

The cooling module 370 includes a heat transfer module, e.g., the heat transfer module 105 of FIG. 1. The heat transfer module can be thermally coupled to the fluid conduit. The heat transfer module can include a thermoelectric cooling (TEC) module. By controlling electrical power supplied to the TEC module, a heat transfer rate from a cold side of the heat transfer module to a warm side of the heat transfer module. The cold side can be thermally coupled to the fluid conduit that circulates the cooling water to the cooling coils 312a and 312b. The cold side can transfer heat from the cooling water in the fluid conduit to the warm side. The warm side can include a heat sink that is thermally coupled to the fluid conduit that circulates the cooling water from the cooling coils 312a and 312b.

In some examples, a second heat sink, e.g., a phase changer material (PCM), can be thermally coupled or attached to the heat sink to further increase heat dissipation, increase the heat transfer rate and thus reduce the temperature of the cooling liquid. The heat transfer module can be configured to cool the cooling water at a cooling rate faster than valves, e.g., by more than one order of magnitude.

In some implementations, the cooling module 370 includes a control system configured to control the heat transfer module. The control system can be integrated in or communicably coupled to the controller 345. In some implementations, the controller 345 is configured to control the cooling module 370 and/or the control valve 340 to control the temperature and/or the flow rate of the cooling liquid. The controller 345 may perform functions similar to the control system of FIG. 1. The controller 345 can be configured to determine a cooling load or a difference between a predicated cooling load and a present cooling load, e.g., based on temperature information from the temperature sensors 355 and/or 360. Based on the determined cooling load or the determined difference, the controller 345 can select at least one of the heat transfer module or the control valve to adjust the temperature and/or the flow rate of the cooling liquid.

In operation, transients in the cooling load of the cooling coils 312a and 312b can cause one or more heat-generating computing devices in the data center 301 to exceed a temperature threshold over short periods. The control valve 340 can have a slow response time and cannot reduce the temperature of the computing devices below the temperature threshold by just increasing the flow rate of the control valve 340. Based on the determined cooling load, the controller 345 can select to increase the supplied electric power of the heat transfer module to increase the heat transfer rate and thus to quickly reduce a temperature of the cooling water supplied to the cooling coils 312a and 312b. Concurrently the controller 345 can also modulate the control valve of the cooling module 370 and/or the control valve 340 to adjust the flow rate of the cooling water.

Figure 4:
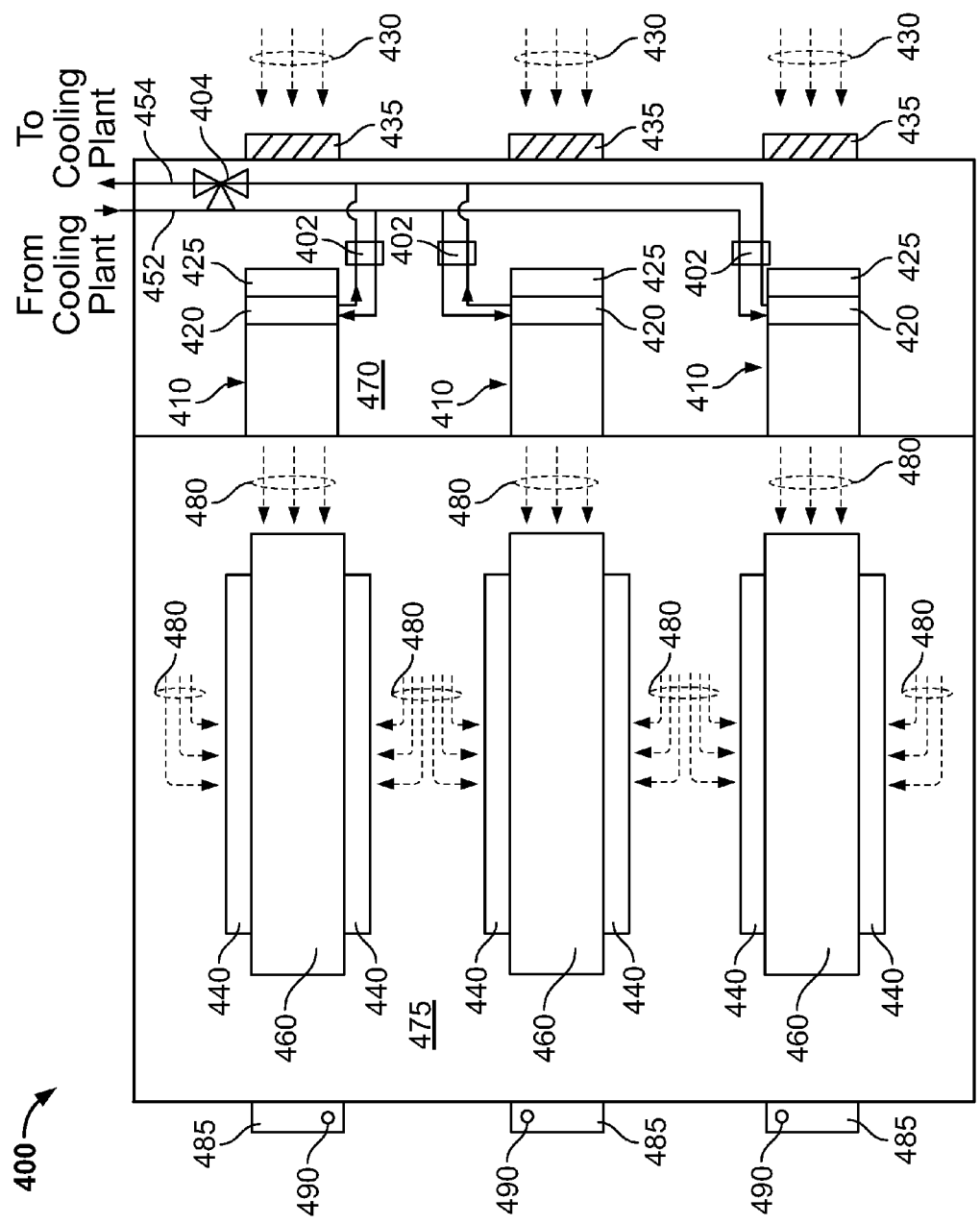
FIG. 4 illustrates a schematic diagram showing another example implementation of a data center cooling system that includes a cooling module for cooling of a data center.

FIG. 4 illustrates a top view of a data center 400 that includes one or more cooling module 402 for supplemental cooling of the data center 400. The data center 400 includes and encloses a plurality of computer racks in a controlled environment. The data center 400 includes infrastructure equipment, described in more detail below, that maintains the data center 400, and the computer racks, at ambient conditions suitable for operation, including cooling equipment and power supply equipment. The cooling module 402 can be the same as or similar to the cooling module 100 of FIG. 1, the cooling module 240 of FIG. 2, or the cooling module 370 of FIG. 3.

As illustrated, the data center 400 receives an outside airflow 430, through louvers 435. The outside airflow 430 is processed by the fan coil unit 410, which generates supply airflow 180 (e.g., a cooling airflow) for a workspace 475.

The fan coil unit 410 includes a filter 425, a cooling coil 420, and a fan. Generally, the filter 425 filters the received outside airflow 430. The cooling coil 420 receives a cooling fluid (e.g., chilled fluid from a chiller or other mechanical refrigeration device, chilled glycol, an evaporatively-cooled fluid, cool fluid from a body of water, refrigerant liquid, or otherwise) from a cooling plant (e.g., a chiller plant, free cooling facility, or other mechanical refrigeration device) through a cooling fluid supply conduit 452 and lowers the temperature of an airflow that enters the fan coil unit 410. The heated cooling liquid can be circulated from the cooling coil 420 to the cooling plant through a cooling fluid supply conduit 454. In some implementations, the cooling coil 420 can be a combination of multiple cooling coils, a direct evaporative cooling module, an indirect evaporative cooling module, or combination thereof.

Cooling fluid can be circulated through the cooling fluid supply conduit 452 and/or the cooling liquid return conduit 454 by a pump (or by natural circulation, for example, in a direct expansion system). The pump can take any appropriate form, such as a standard centrifugal pump. The cooling coil 420 can have a large surface area and be very thin so as to present a low pressure drop to the data center 400. In this way, slower, smaller, and quieter fans can be used to drive air through the fan coil unit 410. As the air passes through the coil 420, its heat is transferred into the fluid in the coil 420, and the air that enters the fan coil unit 410 is cooled.

The fan can circulate the generated supply airflow 480 to the workspace 475. The supply airflow 480 is circulated through open faces of racks and over servers (e.g., server trays) that include heat-generating electronic devices (e.g., processors, memory, and otherwise). As the supply airflow 480 is circulated through the racks and over the servers, heat is transferred from the servers to the supply airflow 480. In some implementations, an amount of heat generated by the servers and transferred to the airflow 480 can be related to, for example, a temperature of the airflow 480 relative to a temperature of the devices, a flow rate of the airflow 480, and a power density of the servers.

A return airflow can be expelled through a chimney 460 placed adjacent to two server rack rows 440. The return airflow, now carrying the heat transferred from the servers, is circulated into a warm air plenum 470, such as an attic space, located adjacent to the workspace 475. Return airflow is circulated back to the fan coil units 410, in some implementations, or can be exhausted from the data center 400.

As illustrated, the system 400 includes a cooling module 402 coupled to a respective cooling coil 420. The cooling module 402 can include a heat transfer module, e.g., the heat transfer module 105 of FIG. 1. The heat transfer module can be thermally coupled to the cooling fluid supply conduit 452 and the cooling fluid return conduit 454. The heat transfer module can cool a flow of the cooling liquid circulated from the cooling fluid supply 452 to the cooling coil 420 to change the temperature of the cooling liquid.

In some examples, the heat transfer module includes a thermoelectric cooling (TEC) module. By controlling electrical power supplied to the TEC module, a heat transfer rate from a cold side of the heat transfer module to a warm side of the heat transfer module. The cold side can be thermally coupled to the cooling fluid supply conduit 452 and transfer heat from the cooling fluid in the conduit 452 to the warm side. In some examples, the warm side of the heat transfer module includes a heat sink to dissipate heat. The heat sink can be thermally coupled to the cooling liquid return conduit 454. A second heat sink, e.g., a phase changer material (PCM), can be thermally coupled to the heat sink to further increase heat dissipation, thus increase the heat transfer rate, and thus reduce the temperature of the cooling liquid. The heat transfer module can cool the cooling liquid at a cooling rate faster than valves, e.g., by more than one order of magnitude.

The cooling module 402 can include a control system, e.g., the control system of FIG. 1, to control the heat transfer module and/or the control valve. The control system can be configured to determine, for the cooling coil 420, a cooling load or a difference between a predicated cooling load and a present cooling load, e.g., based on temperature sensors. Based on the determined cooling load or the determined difference, the control system can select at least one of the heat transfer module or the control valve to adjust the temperature and/or the flow rate of the cooling liquid.

As illustrated, the data center 400 includes a control valve 404, e.g., a three-way ball valve. The control valve 404 can be the control valve 140 of FIG. 1. The control valve 404 can be positioned close to an inlet of the cooling liquid supply conduit 452 and/or an outlet of the cooling liquid return conduit 454. The control valve 404 is fluidly coupled to the cooling liquid supply conduit 452 and/or the cooling liquid return conduit 454 and configured to modulate an overall flow rate of the cooling liquid supplied to the cooling coils 420 in the data center 400. In some examples, the control valve 404 is controlled to be partially opened to adjust the flow rate of the cooling liquid. In some implementations, for each cooling module 402, the data center 400 includes a respective control valve configured to modulate a flow rate of a cooling liquid supplied to the cooling coil 420 that the cooling module 402 is thermally coupled to.

In some implementations, the data center 400 includes a control system, e.g., the control system of FIG. 1. The control system is configured to control the cooling modules 402 and the control valve 404. The control system can determine, for the cooling coils 420, a cooling load or a difference between a predicated cooling load and a present cooling load, e.g., based on temperature sensors. Based on the determined cooling load or the determined difference, the control system can select one or more heat transfer modules of the cooling modules 402 and/or the control valve 404 to adjust the temperature and/or the flow rate of the cooling liquid to the cooling coils 420. In some cases, the control system determines individual cooling load for each cooling coil 420 and selects at least one of the heat transfer module of the cooling module 402 or the control valve 404 to control the temperature and/or the flow rate of the cooling liquid supplied to the cooling coil 420. In some implementations, each cooling module 402 includes a respective control system that can be integrated or communicably coupled to the control system of the data center 400. The control system of the cooling module 402 can be configured to control the heat transfer module of the cooling module 402 and/or the control valve of the cooling module 402.

In some implementations, all server rack rows 440 can have substantially similar power densities. In case of server rack rows 440 with substantially similar power densities, the cooling and/or power requirements can be substantially similar. For example, the fan coil units 410 can generate substantially equal volumes of homogeneously distributed supply airflows 480 between different servers. Within the same context example, the chimneys 460 can exhaust substantially equal volumes of airflows, maintaining all server rack rows 440 at an overall optimized temperature. Further spatial considerations (e.g., dimensions of the chimneys 460, such as width or length) can be relatively similar or identical when the server rack rows 440 have similar or identical power densities.

Other cooling parameters can be adjusted based on a change in power density of one or more racks 440. For example, setpoint supply airflow temperature, setpoint supply cooling fluid temperature, fan speed, number of fan coil units in operation, amount of outside airflow, amount of return airflow, and other parameters can be adjusted based on a change to power density of the racks 440.

The fan coil units 410 are illustrated as placed level with the racks 440 (e.g., on the same floor structure as the racks 140), the fan coil units 410 can be placed in other locations as well without departing from the scope of this disclosure. For example, in some implementations, the fan coil units 410 can be located in an attic space (e.g., above the racks 440 in the warm air plenum 470, with cool air introduced downward through the workspace 475 to the racks 440. The fan coil units 410 could also be suspended, e.g., within the warm air plenum 475 from a structure of the data center 400. In other implementations, fans and coils of the fan coil units 410 can be separated and fluidly coupled together (e.g., ducted) so as to form a field-built, rather than packaged, unit. In even further implementations, the fan coil units 410 can comprise banks of coils and banks of fans rather than packaged units. Adjustments to such configurations of the units 410 based on, for instance, changes in rack power density, can include, for example, changes in fan size, changes in fan speed, changes in a number of coils or coil circuits through which cooling fluid is circulated, changes to cooling fluid temperature.

The data center can be operated in multiple modes of operation, including a recirculation mode (e.g., 100% return airflow is circulated through the fan coil units with no outside airflow), an economizer mode (e.g., 100% outside airflow is circulated through the fan coil units, which can or cannot be further cooled by the cooling coil 420), and a mixed airflow mode (e.g., return and outside airflow are mixed before entering the fan coil unit 410).

An appropriate mode of operation can be determined (e.g., by a control system or controller that is communicably coupled to the fan coil unit 410, and temperature and/or pressure sensors in the workspace 475, chimney 460, racks, or otherwise) based on various sensor readings and measurements of the data center 400 and outside environment, such that the supply airflow 480 is appropriately and efficiently conditioned for the workspace 475. The speed of the fan and/or the flow rate or temperature of a cooling water (or other cooling fluid) flowing in the cooling coil 420 can be controlled in response to measured values of airflow temperature. For example, the pumps driving the cooling liquid can be variable speed pumps that are controlled to maintain a particular temperature in workspace 475. Such control mechanisms can be used to maintain a constant temperature, e.g., of supply airflow 480, of workspace 475, of servers, and/or of warm air plenum 470.

Fresh air can be provided to the workspace 475 by various mechanisms. As illustrated, louvers 435 can be provided from the outside environment to the data center 400, such as powered louvers to connect to the warm air plenum 470. The data center 400 can be controlled to draw air through the warm air plenum 470 when environmental (outside) conditions (such as ambient humidity and temperature) are sufficiently low to permit cooling with outside air. Such louvers 435 can also be ducted to data center 400, and warm air in plenum 470 can simply be exhausted to atmosphere, so that the outside air does not mix with, and get diluted by, the warm air from the servers. Appropriate filtration can also be provided in the system, particularly where outside air is used. As another example, a supplemental air-conditioning unit, such as a standard roof-top unit can be provided to supply necessary exchanges of outside air. Also, such a unit can serve to dehumidify the workspace 475 for the limited latent loads in the data center 400, such as human perspiration.

Also, the workspace 475 can include heat loads other than the server rack rows 440, such as from people in the space and lighting. Where the volume of air passing through the various server rack rows 440 is very high and picks up a very large thermal load from multiple computers, the small additional load from other sources can be negligible, apart from perhaps a small latent heat load caused by workers, which can be removed by a smaller auxiliary air conditioning unit as described above.

In operation, data center 400 can respond to signals from various sensors placed in the data center 400. The sensors can include, for example, thermostats, humidistats, flow meters, and other similar sensors. In one implementation, one or more thermostats can be provided in warm air plenum 470, and one or more thermostats can be placed in workspace 475. In addition, air pressure sensors can be located in workspace 475, and in warm air plenum 470. The thermostats can be used to control the speed of associated pumps, so that if temperature begins to rise, the pumps turn faster to provide additional cooling waters. Thermostats can also be used to control the speed of various items such as data center 400 to maintain a set pressure differential between two spaces, such as warm air plenum 470 and workspace 475, and to thereby maintain a consistent airflow rate. Thermostats can be used to directly or indirectly control the cooling modules 402 and/or the control valve 404. In some examples, the thermostats are communicably coupled to and control the control system of the data center 400 that controls the cooling modules 402 and/or the control valve 404.

In operations, transients in a cooling load of a cooling coil 420 can cause a temperature of a thermal system, e.g., the servers on the server rack rows 440 and/or the workspace 475, to exceed a temperature threshold over short periods. Based on the determined cooling load, the control system of the data center 400 can select at least one of the heat transfer module of the cooling module 402 or the control valve 404. The control system can increase a supplied electric power of the heat transfer module to increase the heat transfer rate and thus to quickly cool the cooling liquid supplied to the cooling coil 420. The control system can also modulate the control valve of the cooling module 402 and/or the control valve 404 to adjust the flow rate of the cooling liquid. The control system can include a feedback system to precisely adjust the temperature of the thermal system to a desired temperature below the temperature threshold.

Figure 5:
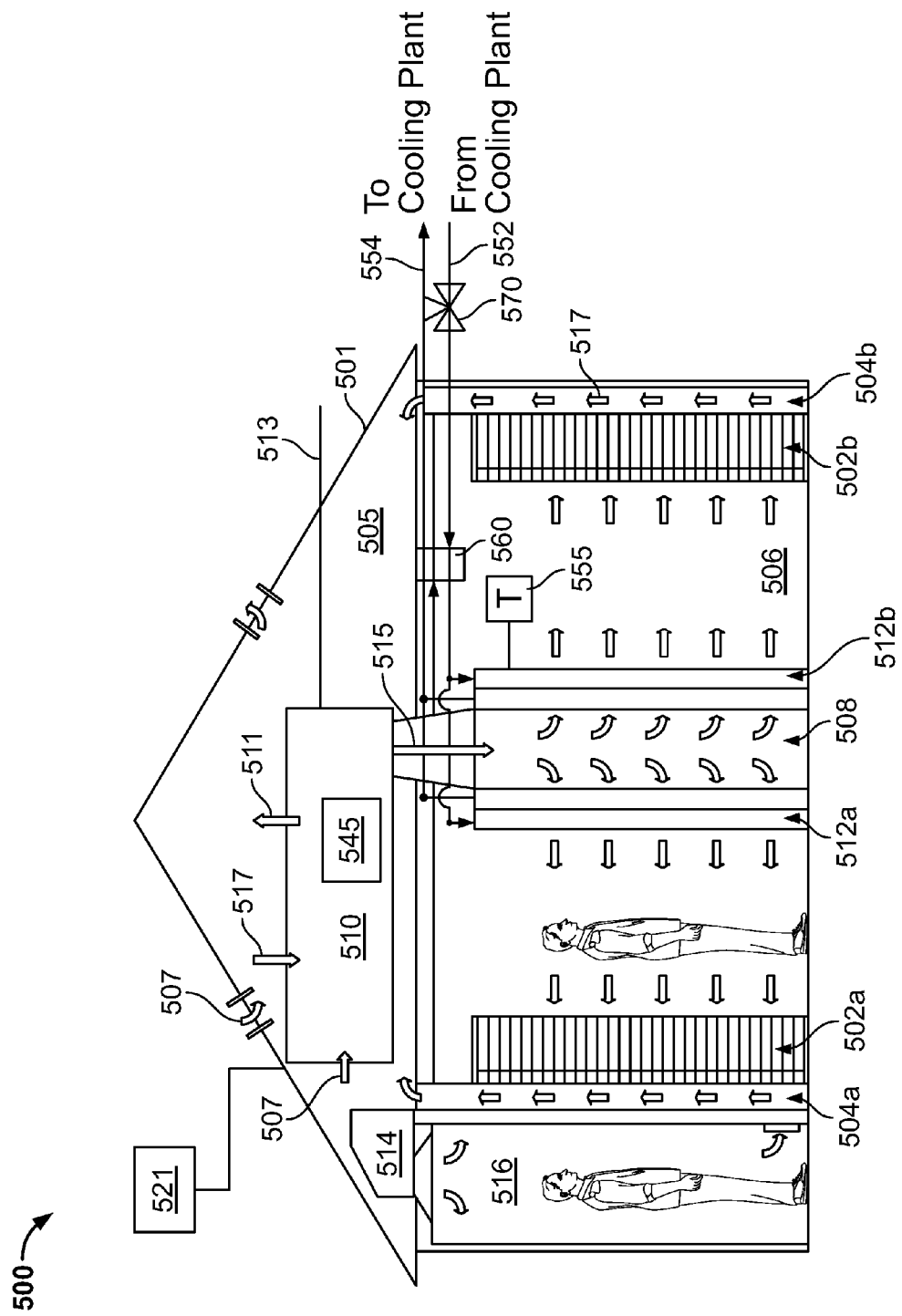
FIG. 5 illustrates a schematic diagram showing another example implementation of a data center cooling system that includes a cooling module for cooling of a data center.

FIG. 5 illustrates a schematic diagram showing another example implementation of a data center cooling system 500 that includes a cooling module 560 for cooling of a computer data center 501. The cooling module 560 can be the same or similar to the cooling module 100 of FIG. 1, the cooling module 240 of FIG. 2, the cooling module 370 of FIG. 3, or the cooling module 402 of FIG. 4.

The cooling system 500 includes an air handling system 510 operable in multiple airflow modes. The air handling system 510 can be placed in an enclosed space within the computer data center 501 (e.g., a ceiling area, an attic, a raised floor or a basement), or in an open space outside the data center (e.g., on the rooftop or side of the data center).

Further, the illustrated air handling system 510 can be constructed as a packaged air handling unit, a modular built-up system, or a field constructed system, to name a few examples. Further, although the components of the air handling system 510 are shown back-to-back, they may be separated by, for example, ductwork or other air circulating conduit, without departing from the scope of the disclosure.

A workspace 506 is defined around the computers, which are arranged in a number of parallel rows and mounted in vertical racks, such as racks 502a, 502b. The racks may include pairs of vertical rails to which are attached paired mounting brackets. Trays containing computers, such as standard circuit boards in the form of motherboards, may be placed on the mounting brackets.

As illustrated, the air handling system 510 receives an outside airflow 507 and a return airflow 517 and expels an exhaust airflow 511. Air quality of an outside environment can be measured by an air quality sensor 521 positioned in the outside environment or in an outside airflow 507 circulated from the outside environment and through the illustrated fenestrations in the data center attic 505.

The air handling system 510 also circulates a supply airflow 515 to the data center 501, for example, through cooling coils 512a, 512b. As further illustrated, the example air handling system 510 receives a cooling fluid 513 to one or more modules of the air handling system 510, for example a direct evaporative cooling module and/or an indirect evaporative cooling module of the air handling system 510. The cooling fluid 513 may, for instance, be deionized water, RO (reverse osmosis) water, distilled water, or other purified fluid.

In some implementations, the air handling system is configured to function according to multiple modes of operation. Each operational mode may provide one or more levels of conditioning (e.g., cooling) for the supply air 515. An appropriate mode of operation may be determined by the air handling system 510 based on various sensor readings and measurements of the outside environment, such that the supply air 515 is appropriately and efficiently conditioned for data center cooling. More specifically, in some modes of operation, controllers may operate the air handling system 510 in two or more operational modes based on, for instance, conditions of the outside environment, conditions of one or more airflows (such as outside airflow 507, supply airflow 515, heated airflow 517), conditions of one or more cooling fluids (such as the cooling water 550), and/or conditions of the outside environment.

In one example, the mounting brackets may be angled rails welded or otherwise adhered to vertical rails in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Additional items may also be cooled using system 500. For example, room 516 is provided with a self-contained fan-coil unit 514 which contains a fan and a cooling coil.

The unit 514 may operate, for example, in response to a thermostat provided in room 516. Room 516 may be, for example, an office or other workspace ancillary to the main portions of the data center 501.

Supply air 515 may circulate from workspace 506 across the trays and into warm-air plenums 504a, 504b behind the trays. The supply air 515 may be drawn into the trays by fans mounted at the back of the trays. The fans may be programmed or otherwise configured to maintain a set exhaust temperature for the air into the warm air plenum, and may also be programmed or otherwise configured to maintain a particular temperature rise across the trays. Where the temperature of the supply air 515 in the work space 506 is known, controlling the exhaust temperature also indirectly controls the temperature rise. The work space 506 may, in certain circumstances, be referenced as a "cold aisle," and the plenums 504a, 504b as "warm aisles."

The workspace 506 air may then be drawn into racks 502a, 502b such as by fans mounted on the many trays that are mounted in racks 502a, 502b. This air may be heated as it passes over the trays and through power supplies running the computers on the trays, and may then enter the warm-air plenums 504a, 504b. Each tray may have its own power supply and fan, with the power supply at the back edge of the tray, and the fan attached to the back of the power supply. All of the fans may be configured or programmed to deliver air at a single common temperature, such as at a set 113° F. (45° C.). The process may then be continuously readjusted as air handling system 510 captures and circulates the heated air 517.

Cooling of particular electronic equipment, such as microprocessors, may be improved even where the flow of air across the trays is slow, by attaching impingement fans to the tops of the microprocessors or other particularly warm components, or by providing heat pipes and related heat exchangers for such components.

The heated air 517 may be routed upward into a ceiling area, or attic 505, or into a raised floor or basement, or other appropriate space, and may be gathered there by air handling system 510, which may include, for example, one or more centrifugal fans appropriately sized for the task. The air handling system 510 may then deliver the air back into a plenum 508 located adjacent to the workspace 506. The plenum 508 may be simply a bay-sized area in the middle of a row of racks, that has been left empty of racks, and that has been isolated from any warm-air plenums on either side of it, and from cold-air work space 506 on its other sides. Alternatively, air may be cooled by coils 512a, 512b defining a border of warm-air plenums 504a, 504b and expelled directly into workspace 506, such as at the tops of warm-air plenums 504a, 504b.

Cooling coils 512a, 512b may be located on opposed sides of the plenum approximately flush with the fronts of the racks. The coils may have a large surface area and be very thin so as to present a low pressure drop to the system 500. In this way, slower, smaller, and quieter fans may be used to drive air through the system. Protective structures such as louvers or wire mesh may be placed in front of the coils 512a, 512b to prevent them from being damaged.

In operation, air handling system 510 pushes air down into plenum 508, causing increased pressure in plenum 508 to push air out through cooling coils 512a, 512b. A flow of a cooling liquid is circulated from a cooling plant, e.g., a chiller plant, to the coils 512a, 512b through a cooling liquid supply conduit 552. As the air passes through the coils 512a, 512b, its heat is transferred into the flow of cooling liquid in the coils 512a, 512b, and the air is cooled. The heated flow of the cooling liquid is circulated from the coils 512a, 512b back to the cooling plant through a cooling liquid return conduit 554.

The speed of a fan in the air handling system 510 and/or the flow rate or temperature of the cooling liquid flowing in the cooling coils 512a, 512b can be controlled in response to measured values. For example, pumps driving the cooling liquid may be variable speed pumps that are controlled to maintain a particular temperature in work space 506. A control valve 570, e.g., a three-way ball valve, can be modulated to adjust the flow rate of the cooling liquid provided to the coils 512a, 512b. Such control mechanisms can be used to maintain a constant temperature in workspace 506 or plenums 504a, 504b and attic 505.

As illustrated, the system 500 includes the cooling module 560 for providing supplemental cooling for the cooling coils 512a, 512b. The cooling module 560 is coupled to the cooling fluid supply conduit 552 and the cooling fluid return conduit 554 and configured to control a temperature of the cooling liquid provided to the cooling coils 512a, 512b.

In some implementations, the cooling module 560 includes a heat transfer module, e.g., the heat transfer module 105 of FIG. 1. The heat transfer module can be thermally coupled to the cooling fluid supply conduit 552 and the cooling fluid return conduit 554 between the cooling plant and the cooling coils 512a, 512b. The heat transfer module can cool the cooling liquid to change the temperature of the cooling liquid. In some examples, the heat transfer module includes a thermoelectric cooling (TEC) module. Controlling electrical power supplied to the TEC module can control a heat transfer rate from a cold side of the heat transfer module to a warm side of the heat transfer module, thus changing the temperature of the cooling liquid. The cold side can be thermally coupled to the cooling liquid supply conduit 552 and transfer heat from the cooling liquid in the cooling liquid supply conduit 552 to the warm side.

In some examples, the warm side of the heat transfer module includes a heat sink to dissipate heat. The heat sink can be thermally coupled to the cooling liquid return conduit 554. A second heat sink, e.g., a phase changer material (PCM), can be thermally coupled to the heat sink to further increase heat dissipation, increase the heat transfer rate and thus reduce the temperature of the cooling liquid. The heat transfer module can cool the cooling liquid at a cooling rate faster than valves, e.g., by more than one order of magnitude.

In some implementations, the cooling module 560 includes a control system, e.g., the control system of FIG. 1, to control the heat transfer module. The control system can be configured to determine, for the cooling coils 512a, 512b, a cooling load or a difference between a predicated cooling load and a present cooling load. Based on the determined cooling load or the determined difference, the control system can control the heat transfer module to adjust the temperature of the cooling liquid.

The system 500 can include an airflow temperature sensor 555 positioned at a leaving face of one or both of the cooling coils 512a and 512b. The temperature sensor 555 can thus measure a leaving air temperature from the cooling coils 512a and/or 512b. Temperature information from the temperature sensor 555 can be used, e.g. by the control system of the cooling module 560, to determine a cooling load of the cooling coils 512a, 512b.

As illustrated, the system 500 includes a main controller 545 (e.g., processor-based electronic device or other electronic controller) of the cooling system of the data center, which is communicably coupled to each control valve (such as control valve 570) of the data center and/or individual controllers associated with the control valves and/or the control system of the cooling module 560. For example, the main controller 545 can be a master controller communicably coupled to slave controllers at the respective control valves. In some implementations, the main controller 545 can be a Proportional-Integral-Derivative (PID) controller. Alternatively, other control schemes, such as PI or otherwise, can be utilized. As another example, the control scheme can be implemented by a controller utilizing a state space scheme (e.g., a time-domain control scheme) representing a mathematical model of a physical system as a set of input, output and state variables related by first-order differential equations. In some implementations, the main controller 545 can be all or part of a distributed control system.

In operation, the main controller 545 can receive the temperature information from the temperature sensor 555, temperature information (e.g., information about an outside airflow 507, a return airflow from the data center such as the heated air 517, the supply airflow 515, other airflows, and other cooling fluids), as well as information regarding an air quality of the outside environment. Based on the received information, the main controller 545 can determine or predicate a cooling load of the cooling coils 560 and/or the air handling system 510, and control the operation of the air handling system 510 and/or the control module 560 and/or the control valve 570.

In some examples, transients in the cooling load can cause the workspace 506 to exceed a temperature threshold over short periods. The control valve 570 can have a slow response time and cannot reduce the temperature of the workspace 506 under the temperature threshold by just increasing the flow rate of the control valve 570. Based on the determined cooling load, the main controller 545 and/or the controlling system of the cooling module 560 can select to increase the supplied electric power of the heat transfer module of the cooling module 560 to increase the heat transfer rate and thus to quickly reduce the temperature of the cooling liquid supplied to the cooling coils 512a, 512b. Concurrently the main controller 545 can also modulate the control valve 570 to increase the flow rate of the cooling liquid. The main controller 545 can also control the air handling system 510 to help control the temperature of the workspace 506.

Figure 6:
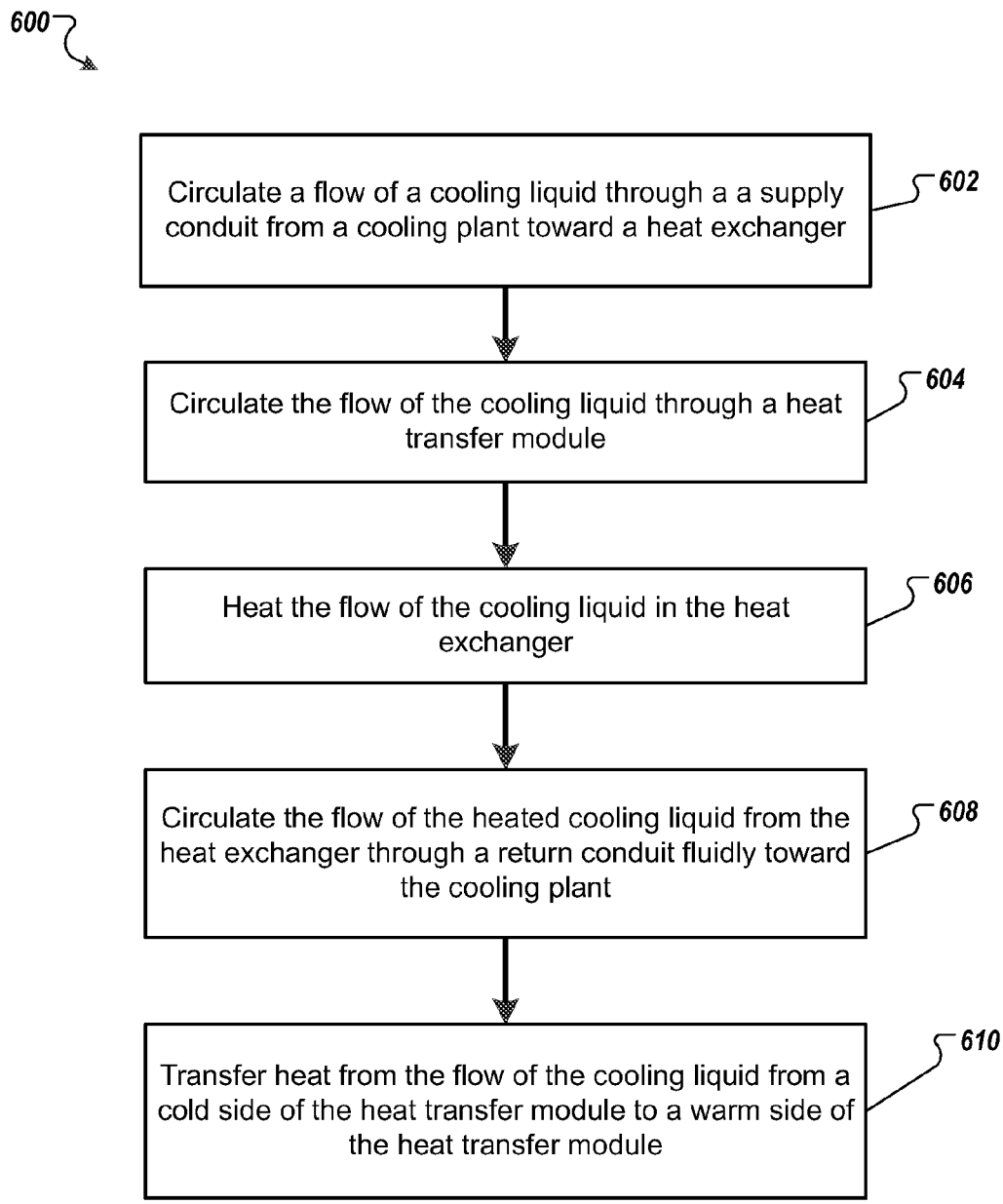
FIG. 6 illustrates an example process for cooling of a data center.

FIG. 6 illustrates an example process 600 for cooling of a data center. The example process 600 can be used by a cooling module, e.g., the cooling module 100 of FIG. 1, to provide cooling for the data center.

The process circulates a flow of a cooling liquid through a supply conduit from a cooling plant toward a heat exchanger (602). The supply conduit can be the cooling liquid supply conduit 125 of FIG. 1. In some examples, the supply conduit includes a cooling liquid supply piping system. The cooling liquid may be chilled fluid from a chiller plant. The heat exchanger can be the heat exchanger 135 of FIG. 1. In some examples, the heat exchanger includes one or more cooling coils or cooling plates.

The process circulates the flow of the cooling liquid through a heat transfer module (604). The heat transfer module is thermally coupled to the supply and return conduits between the cooling plant and the heat exchanger and configured to adjust a temperature of the cooling liquid provided to the heat exchanger. The heat transfer module can be the heat transfer module 105 of FIG. 1.

The process heats the flow of the cooling liquid in the heat exchanger (606). In some examples, the heat exchanger includes an air-to-liquid heat exchanger, which is positioned to receive a heated airflow from one or more racks in the data center. At least one rack supports a number of heat-generating electronic devices. The heat exchanger transfers the heat from the heated airflow to the flow of the cooling liquid. Consequently, the heated airflow is cooled down and the flow of the cooling liquid is heated up.

The process circulates the flow of the heated cooling liquid from the heat exchanger through a return conduit fluidly toward the cooling plant (608). The return conduit is fluidly coupled between the heat exchanger and the cooling plant. The return conduit can be the cooling liquid return conduit 130 of FIG. 1.

The process transfers heat from the flow of the cooling liquid from a cold side of the heat transfer module to a warm side of the heat transfer module (610). The cold side and the warm side can be the cold side 110 and the warm side 115 of FIG. 1, respectively. The cold side of the heat transfer module is thermally coupled to the supply conduit. In some implementations, the cold side includes an input to receive the flow of the cooling liquid from the cooling plant and an output to supply the cooled flow of cooling liquid to the heat exchanger. The warm side of the heat transfer module is thermally coupled to the return conduit. In some implementations, the warm side includes an input to receive the heated flow of the cooling liquid from the heat exchanger and an output to supply the heated flow of the cooling liquid to the cooling plant.

In some examples, the heat transfer module includes a thermoelectric cooling module, e.g., a Peltier cooler. The process can supply electrical power, e.g., a supply voltage, to the thermoelectric cooling module to control a heat transfer rate from the cold side to the warm side. Increasing or decreasing the electrical power can increase or decrease the heat transfer rate, respectively. The warm side can include a heat sink to dissipate heat. Increasing heat dissipation of the heat sink can also increase the heat transfer rate. In some implementations, a second heat sink, e.g., a phase change material (PCM), is thermally coupled to the heat sink, e.g., by using a thermally conductive material. The second heat sink can be configured to further increase heat dissipation from the warm side and thus increase heat transfer rate.

In some implementations, the cooling module includes a control valve that is fluidly coupled to the supply conduit or the return conduit. The control valve can be the control valve 140 of FIG. 1. The process can circulate the cooling liquid through the control valve and modulate a flow rate of the flow of the cooling liquid supplied to the heat exchanger with the control valve.

In some implementations, the cooling module includes a control system communicably coupled to both the heat transfer module and the control valve. The control system can be the control system of FIG. 1. The process can determine a cooling load of the heat exchanger with the control system and select at least one of the heat transfer module or the control valve to adjust based on the determined cooling load. Based on selecting the heat transfer module, the process adjusts the heat transfer module to increase the heat transfer rate from the cold side to the warm side and thus increase a cooling rate for the cooling load. Based on selecting the control valve, the process modulates the control valve to adjust the flow rate of the cooling liquid to the heat exchanger and thus adjust the cooling rate. In some examples, the process determines a difference between a predicated cooling load and a present cooling load of the heat exchanger, and selects at least one of the heat transfer module or the control valve to adjust the cooling rate based on the determined difference.

Embodiments of the subject matter and the functional operations described in this specification, e.g., the functional operations performed by one or more control systems, can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, e.g., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

The processes and logic flows described in this specification can be performed by one or more programmable control systems or controllers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Control systems or controllers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a control system or controller are a central processing unit for performing or executing instructions and one or more memory devices for storing instructions and data. Generally, a control system or controller will also include, or be operatively coupled to receive data from or transfer data to, or both, one or more mass storage devices for storing data, e.g., magnetic, magneto-optical disks, or optical disks. However, a computer need not have such devices.

Computer-readable media suitable for storing computer program instructions and data include all forms of non-volatile memory, media and memory devices, including by way of example semiconductor memory devices. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some examples be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made. For example, various combinations of the components described herein may be provided for implementations of similar apparatuses. Further, in some example implementations of the cooling apparatus described herein, a liquid-to-liquid heat exchanger may be included in addition to or in place of an air-to-liquid heat exchanger in order to cool electronic equipment supported in one or more racks. For instance, the liquid-to-liquid heat exchanger may receive heat from the electronic equipment into a working liquid and transfer the heat to a cooling fluid. Accordingly, other implementations are within the scope of the present disclosure.

What is claimed is:

1. A data center cooling system, comprising:
    a cooling liquid supply conduit fluidly coupled between a cooling plant and an air-to-liquid heat exchanger positioned to receive a heated airflow from one or more racks in a data center, at least one rack supporting a plurality of heat-generating electronic devices;
    a cooling liquid return conduit fluidly coupled between the cooling plant and the air-to-liquid heat exchanger; and
    a heat transfer module comprising a thermoelectric cooling module thermally coupled to the cooling liquid supply and return conduits between the cooling plant and the air-to-liquid heat exchanger, the heat transfer module comprising a cold side and a warm side, the cold side thermally coupled to the cooling liquid supply conduit to transfer heat from a flow of a cooling liquid in the cooling liquid supply conduit to the warm side of the heat transfer module, the warm side comprising a heat sink that is thermally coupled to the cooling liquid return conduit.

2. The data center cooling system of claim 1, wherein the thermoelectric cooling module comprises a Peltier cooler.

3. The data center cooling system of claim 1, wherein the thermoelectric cooling module comprises a power input to receive electrical power.

4. The data center cooling system of claim 1, further comprising:
a control valve fluidly coupled to one of the cooling liquid supply conduit or the cooling liquid return conduit, and configured to modulate a flow rate of the cooling liquid supplied to the air-to-liquid heat exchanger.

5. The data center cooling system of claim 4, further comprising a control system communicably coupled to the control valve and the heat transfer module.

6. The data center cooling system of claim 5, wherein the control system is configured to perform operations comprising:
determining a cooling load of the air-to-liquid heat exchanger;
based on the determined cooling load, selecting at least one of the heat transfer module or the control valve to adjust; and
based on selecting the heat transfer module, adjusting the heat transfer module to increase a heat transfer rate from the cold side to the warm side.

7. The data center cooling system of claim 5, wherein the control system is further configured to perform operations comprising:
based on selecting the control valve, modulating the control valve to adjust the flow rate of the cooling liquid to the air-to-liquid heat exchanger.

8. The data center cooling system of claim 5, wherein selecting at least one of the heat transfer module or the control valve to adjust comprises:
determining a difference between a predicated cooling load and a present cooling load; and
based on the determined difference, selecting at least one of the heat transfer module or the control valve to adjust.

9. The data center cooling system of claim 1, further comprising a second heat sink thermally coupled to the heat sink.

10. The data center cooling system of claim 9, wherein the second heat sink comprises a phase change material attached to the heat sink.

11. The data center cooling system of claim 1, wherein the cooling plant comprises a chillerless cooling plant.

12. The data center cooling system of claim 1, wherein the cold side comprises an input to receive the flow of the cooling liquid from the cooling plant and an output to supply a cooled flow of cooling liquid to the air-to-liquid heat exchanger.

13. The data center cooling system of claim 12, wherein the warm side comprises an input to receive a heated flow of the cooling liquid from the air-to-liquid heat exchanger and an output to supply the heated flow of the cooling liquid to the cooling plant.

14. A method for cooling a data center, comprising:
circulating a flow of a cooling liquid through a supply conduit from a cooling plant toward an air-to-liquid heat exchanger;
circulating the flow of the cooling liquid through a heat transfer module comprising a thermoelectric cooling module that is thermally coupled to the supply conduit between the cooling plant and the air-to-liquid heat exchanger;
heating the flow of the cooling liquid in the air-to-liquid heat exchanger;
circulating the flow of the heated cooling liquid through a return conduit toward the cooling plant from the air-to-liquid heat exchanger; and
transferring heat from the flow of the cooling liquid from a cold side of the heat transfer module to a warm side of the heat transfer module that is thermally coupled to the return conduit.

15. The method of claim 14, further comprising:
circulating a heated airflow to the air-to-liquid heat exchanger from one or more racks in a data center, at least one rack supporting a plurality of heat-generating electronic devices; and
heating the flow of the cooling liquid in the air-to-liquid heat exchanger with heat from the heated airflow.

16. The method of claim 14, further comprising supplying electrical power to the thermoelectric cooling module.

17. The method of claim 14, further comprising:
circulating the cooling liquid through a control valve that is fluidly coupled to one of the supply conduit or the return conduit; and
modulating a flow rate of the flow of the cooling liquid supplied to the air-to-liquid heat exchanger with the control valve.

18. The method of claim 17, further comprising:
determining a cooling load of the air-to-liquid heat exchanger;
based on the determined cooling load, selecting at least one of the heat transfer module or the control valve to adjust; and
based on selecting the heat transfer module, adjusting the heat transfer module to increase a heat transfer rate from the cold side to the warm side.

19. The method of claim 18, further comprising:
based on selecting the control valve, modulating the control valve to adjust the flow rate of the cooling liquid to the air-to-liquid heat exchanger.

20. The method of claim 18, wherein selecting at least one of the heat transfer module or the control valve to adjust comprises:
determining a difference between a predicated cooling load and a present cooling load; and
based on the determined difference, selecting at least one of the heat transfer module or the control valve to adjust.

21. The method of claim 14, wherein the warm side comprises a first heat sink, and a second heat sink is thermally coupled to the first heat sink.

22. The method of claim 21, wherein the second heat sink comprises a phase change material attached to the first heat sink.

23. A data center cooling system, comprising:
a thermoelectric cooling module thermally coupled to a cooling liquid supply piping system and a cooling liquid return piping system;
a cooling coil fluidly coupled to the cooling liquid supply piping system and the cooling liquid return piping system, the cooling coil positioned to transfer heat from an airflow circulated over rack-mounted heat generating electronic devices in a data center to a flow of a cooling liquid circulated through the cooling liquid supply piping system and the cooling liquid return piping system; and a control system that comprises a controller and a control valve that is positioned in one of the cooling liquid supply piping system or the cooling liquid return piping system, the control system communicably coupled to the thermoelectric module and comprising a processor and a memory that comprises instructions operable, when executed by the processor, to perform operations comprising:

determining a cooling load of the cooling coil; and based on the determined cooling load, adjusting one or both of the control valve or the thermoelectric module to adjust a characteristic of the flow of the cooling liquid.

24. The data center cooling system of claim 23, wherein adjusting one or both of the control valve or the thermoelectric module comprises adjusting the thermoelectric module, and the operations further comprise:

adjusting a temperature of the flow of the cooling liquid circulated from the thermoelectric module to the cooling coil in the cooling liquid supply piping system.

25. The data center cooling system of claim 24, wherein adjusting the thermoelectric module comprises adjusting a power input to the thermoelectric module to adjust an amount of heat transferred from the cooling liquid circulated in the cooling liquid supply piping system, to a hot side of the thermoelectric module, through a cold side of the thermoelectric module.

26. The data center cooling system of claim 25, wherein the thermoelectric module further comprises a heat sink thermally coupled to the hot side of the thermoelectric module.

27. The data center cooling system of claim 25, wherein the heat sink comprises one or both of a heated flow of the cooling liquid circulated through the cooling liquid return piping system from the cooling coil, or a heat transfer material coupled to the hot side of the thermoelectric module.

28. The data center cooling system of claim 23, wherein adjusting one or both of the control valve or the thermoelectric module comprises adjusting the control valve, and the operations further comprise:

adjusting a flow rate of the flow of the cooling liquid circulated to the cooling coil in the cooling liquid supply piping system.

29. The data center cooling system of claim 23, wherein the operations further comprise:

determining a rate of change of the cooling load over a particular time duration; and selecting, for adjustment, the thermoelectric module or the control valve based at least in part on the determined rate of change of the cooling load.

* * * * *